US010903791B2

(12) United States Patent
Naing et al.

(10) Patent No.: US 10,903,791 B2
(45) Date of Patent: *Jan. 26, 2021

(54) SUPER-REGENERATIVE TRANSCEIVER WITH IMPROVED FREQUENCY DISCRIMINATION

(71) Applicant: MUMEC, INC., Oakland, CA (US)

(72) Inventors: Thura Lin Naing, Union City, CA (US); Tristan Orion Rocheleau, Berkeley, CA (US)

(73) Assignee: MUMEC, INC., Oakland, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/485,105

(22) PCT Filed: Feb. 11, 2018

(86) PCT No.: PCT/US2018/017726
§ 371 (c)(1),
(2) Date: Aug. 9, 2019

(87) PCT Pub. No.: WO2018/148615
PCT Pub. Date: Aug. 16, 2018

(65) Prior Publication Data
US 2019/0379416 A1    Dec. 12, 2019

Related U.S. Application Data

(60) Provisional application No. 62/457,823, filed on Feb. 11, 2017, provisional application No. 62/457,825, filed on Feb. 11, 2017.

(51) Int. Cl.
*H03B 5/32* (2006.01)
*H04B 1/16* (2006.01)
(Continued)

(52) U.S. Cl.
CPC ............ *H03B 5/32* (2013.01); *H03B 5/1215* (2013.01); *H03B 5/30* (2013.01); *H03B 5/323* (2013.01);
(Continued)

(58) Field of Classification Search
None
See application file for complete search history.

(56) References Cited

U.S. PATENT DOCUMENTS 5,491,604 A    2/1996   Nguyen
6,236,281 B1   5/2001   Nguyen
(Continued)

FOREIGN PATENT DOCUMENTS

WO    2015126498    11/2015
WO    2015176041    11/2015
(Continued)

OTHER PUBLICATIONS

Naing, "Capacitive-Gap MEMS Resonator-Based Oscillator Systems for Low-Power Signal Processing," May 1, 2017, 186 pgs., Ph.D. Thesis, Department of Engineering—Electrical Engineering and Computer Sciences, University of California, Berkeley, California, USA [Uploaded in 5 parts].
(Continued)

*Primary Examiner* — Lana N Le
(74) *Attorney, Agent, or Firm* — Almanac IP Advisors LLP

(57) ABSTRACT

The present disclosure provides a super-regenerative transceiver with a feedback element having a controllable gain. The super-regenerative transceiver utilizes the controllable gain to improve RF signal data sensitivity and improve RF signal data capture rates. Super-regenerative transceivers described herein permit signal data capture over a broad range of frequencies and for a range of communication (Continued)

protocols. Super-regenerative transceivers described herein are tunable, consume very little power for operation and maintenance, and permit long term operation even when powered by very small power sources (e.g., coin batteries).

28 Claims, 19 Drawing Sheets

(51) Int. Cl.
| | |
|---|---|
| H03B 5/30 | (2006.01) |
| H03B 5/12 | (2006.01) |
| H03D 11/04 | (2006.01) |
| H04L 27/12 | (2006.01) |
| H03D 11/08 | (2006.01) |
| H03H 9/24 | (2006.01) |
| H03H 9/02 | (2006.01) |
| H03H 3/02 | (2006.01) |

(52) U.S. Cl.
CPC ............ *H03D 11/04* (2013.01); *H03D 11/08* (2013.01); *H03H 9/02259* (2013.01); *H03H 9/02393* (2013.01); *H03H 9/2447* (2013.01); *H03H 9/2457* (2013.01); *H04B 1/16* (2013.01); *H04L 27/127* (2013.01); *H03D 2200/0074* (2013.01); *H03H 3/02* (2013.01); *H03H 9/02228* (2013.01); *H03H 2003/027* (2013.01)

(56) References Cited

U.S. PATENT DOCUMENTS

| | | | |
|---|---|---|---|
| 6,970,496 | B1 | 11/2005 | Ben-Bassat |
| 7,403,756 | B1 | 7/2008 | Jiacinto et al. |
| 8,760,233 | B2 | 6/2014 | Steeneken |
| 9,490,746 | B1 | 11/2016 | Madala et al. |
| 10,177,742 | B2* | 1/2019 | Nguyen ................. H03H 9/465 |
| 2001/0033121 | A1 | 10/2001 | Nguyen |
| 2006/0132261 | A1 | 6/2006 | Sonoda |
| 2006/0261703 | A1 | 11/2006 | Quevy |
| 2008/0012659 | A1 | 1/2008 | Frank |
| 2010/0189188 | A1 | 7/2010 | Li |
| 2010/0263445 | A1 | 10/2010 | Hayner |
| 2011/0260810 | A1 | 10/2011 | Quevy |
| 2013/0194048 | A1 | 8/2013 | Feng et al. |
| 2013/0268227 | A1 | 10/2013 | Opris |
| 2014/0018021 | A1 | 1/2014 | Suda et al. |
| 2014/0028410 | A1 | 1/2014 | Pedersen |
| 2014/0176248 | A1 | 6/2014 | Caffee et al. |
| 2014/0355655 | A1* | 12/2014 | Chakraborty ............ H04B 1/40 375/219 |
| 2015/0077094 | A1 | 3/2015 | Baldwin et al. |
| 2015/0226556 | A1* | 8/2015 | Aaltonen ............ G01C 19/5712 73/504.12 |
| 2015/0226557 | A1 | 8/2015 | Aaltonen |
| 2015/0333475 | A1* | 11/2015 | Blumenthal ........ H01S 3/10061 372/20 |
| 2016/0195598 | A1 | 7/2016 | Reitsma |
| 2017/0047893 | A1 | 2/2017 | Nguyen et al. |
| 2019/0131952 | A1 | 5/2019 | Valzasina et al. |

FOREIGN PATENT DOCUMENTS

| | | | |
|---|---|---|---|
| WO | 2015179407 | 11/2015 | |
| WO | WO-2015176041 A1 * | 11/2015 | ......... H03H 11/0466 |
| WO | 2018148615 | 8/2018 | |
| WO | 2018148616 | 8/2018 | |

OTHER PUBLICATIONS

International Search Report for PCT/US2018/017726, dated Jun. 21, 2018, 4 pgs.

Written Opinion of the International Search Authority for PCT/US2018/017726, dated Jun. 21, 2018, 15 pgs.

International Search Report for PCT/US2018/017727, dated May 2, 2018, 2 pgs.

Written Opinion of the International Search Authority for PCT/US2018/017727, dated May 2, 2018, 14 pgs.

Rocheleau, et. al, "Acoustic whispering gallery mode resonator with Q> 109,000 at 515MHz," 2012 IEEE 25th International Conference on Micro Electro Mechanical Systems (MEMS), Jan. 29, 2012, pp. 672-675, IEEE.

Grutter, et. al, "A Platform for On-Chip Silica Optomechanical Oscillators with Integrated Waveguides," CLEO: Science and Innovations, May 6, 2012, Optical Society of America.

Naing, et. al, "2.97-GHz CVD diamond ring resonator with Q> 40,000," 2012 IEEE International Frequency Control Symposium (FCS), May 21, 2012, pp. 1-6, IEEE.

Barrow, et. al, "A real-time 32.768-kHz clock oscillator using a 0.0154-mm 2 micromechanical resonator frequency-setting element," 2012 IEEE International Frequency Control Symposium (FCS), May 21, 2012, pp. 1-6, IEEE.

Naing, et. al, "Vibration-insensitive 61-MHz micromechanical disk reference oscillator," 2012 IEEE International Frequency Control Symposium (FCS), May 21, 2012, pp. 1-6, IEEE.

Grine, et. al, "Wafer-scale silica optomechanical oscillators with low threshold power and low phase noise for monolithic optical frequency references," 2012 International Conference on Optical MEMS and Nanophotonics, Aug. 6, 2012.

Rocheleau, et. al, "Enhancement of mechanical Q for low phase noise optomechanical oscillators," 2013 IEEE 26th International Conference on Micro Electro Mechanical Systems (MEMS), Jan. 20, 2013, pp. 118-121, IEEE.

Grine, et. al, "Phase Noise Spectrum and Carrier Power Modeling of High Performance Optomechanical Oscillators," CLEO: QELS_Fundamental Science, Jun. 9, 2013, Optical Society of America.

Rocheleau, et. al, "Long-term stability of a hermetically packaged MEMS disk oscillator," 2013 Joint European Frequency and Time Forum & International Frequency Control Symposium (EFTF/IFC), Jul. 21, 2013, pp. 209-212, IEEE.

Wu, et. al, "Micromechanical disk array for enhanced frequency stability against bias voltage fluctuations," 2013 Joint European Frequency and Time Forum & International Frequency Control Symposium (EFTF/IFC), Jul. 21, 2013, pp. 547-550, IEEE.

Naing, et. al, "A 78-microwatt GSM phase noise-compliant pierce oscillator referenced to a 61-MHz wine-glass disk resonator," 2013 Joint European Frequency and Time Forum & International Frequency Control Symposium (EFTF/IFC), Jul. 21, 2013, pp. 562-565, IEEE.

Rocheleau, et. al, "A micromechanical parametric oscillator for frequency division and phase noise reduction," 2014 IEEE 27th International Conference on Micro Electro Mechanical Systems (MEMS), Jan. 26, 2014, pp. 210-213, IEEE.

Beyazoglu, et. al, "A multi-material Q-boosted low phase noise optomechanical oscillator," 2014 IEEE 27th International Conference on Micro Electro Mechanical Systems (MEMS), Jan. 26, 2014, pp. 1193-1196, IEEE.

Naing, et. al, "Active Q-control for improved insertion loss micromechanical filters," 2014 IEEE International Frequency Control Symposium (FCS), May 19, 2014, pp. 1-6, IEEE.

Rocheleau, et. al, "A MEMS-Based Tunable RF Channel-Selecting Super-Regenerative Transceiver for Wireless Sensor Nodes," Tech. Digest, Jun. 2014, pp. 83-86.

Beyazoglu, et. al, "A super-regenerative optical receiver based on an optomechanical oscillator," 2015 28th IEEE International Conference on Micro Electro Mechanical Systems (MEMS), Jan. 18, 2015, pp. 976-979, IEEE.

Naing, et. al, "Simultaneous multi-frequency switchable oscillator and FSK modulator based on a capacitive-gap MEMS disk array," 2015 28th IEEE International Conference on Micro Electro Mechanical Systems (MEMS), Jan. 18, 2015, pp. 1024-1027, IEEE.

Nilchi, et. al, "Third order intermodulation distortion in capacitive-gap transduced micromechanical filters," 2015 Joint Conference of

(56) References Cited

OTHER PUBLICATIONS the IEEE International Frequency Control Symposium & the European Frequency and Time Forum (FCS), Apr. 12, 2015, pp. 5-10, IEEE.
Schneider, et. al, "Gap reduction based frequency tuning for AlN capacitive-piezoelectric resonators," 2015 Joint Conference of the IEEE International Frequency Control Symposium & the European Frequency and Time Forum (FCS), Apr. 12, 2015, pp. 700-705, IEEE.
Nilchi, et. al, "Zero quiescent power VLF mechanical communication receiver," 2015 Transducers—2015 18th International Conference on Solid-State Sensors, Actuators and Microsystems (Transducers), Jun. 21, 2015, pp. 129-132, IEEE.
Naing, et. al, "High-Q UHF Spoke-Supported Ring Resonators," Journal of Microelectromechanical Systems, Feb. 2016, pp. 11-29, vol. 25, issue 1, IEEE.
Otis, et al., "A 400µW-RX, 1.6mW-TX Super-Regenerative Transceiver for Wireless Sensor Networks," Digest of Technical Papers 2005 IEEE International Solid-State Circuits Conference, Feb. 6-10, 2005, pp. 396, 397, 606, vol. 1, IEEE International, San Francisco, CA USA. (3 pages).
Otis, et al., "An Ultra-Low Power MEMS-Based Two-Channel Transceiver for Wireless Sensor Networks," Digest of Technical Papers 2004 Symposium on VLSI Circuits, Jan. 1, 2004, pp. 20-23, Gaithersburg, MD, USA. (4 pages).
Extended European Search Report for EP Application No. 18751948.3 dated Feb. 5, 2020. (10 pages).
Extended European Search Report for EP Application No. 18751127.4 dated Jan. 29, 2020. (12 pages).
Notice of Allowance for U.S. Appl. No. 16/314,656 dated Apr. 15, 2020. (9 pages).

\* cited by examiner

A

B

SUPER-REGENERATIVE TRANSCEIVER WITH IMPROVED FREQUENCY DISCRIMINATION

CROSS-REFERENCE TO RELATED APPLICATIONS

This application is the National Stage of International Application No. PCT/US18/17726, filed Feb. 11, 2018, which claims the benefit of priority to U.S. Provisional Patent Application No. 62/457,823, filed on Feb. 11, 2017, and U.S. Provisional Patent Application No. 62/457,825, filed on Feb. 11, 2017, each of which are hereby incorporated by reference in their entirety, including all descriptions, references, figures, and claims for all purposes.

STATEMENT REGARDING FEDERALLY SPONSORED RESEARCH OR DEVELOPMENT

This invention was made with government support under Award Nos. (FAIN) 1549465 and 1738563 awarded by National Science Foundation. The government has certain rights in the invention.

BACKGROUND

Field of the Disclosure

The disclosure relates generally to wireless communication receivers, wireless communication transmitters, and electronic oscillator designs, systems, methods, and devices. Particularly, the disclosure relates to designs, systems, methods and devices for realizing improvements to super-regenerative resonator architectures used in wireless receivers, wireless transmitters, and electronic oscillators. More specifically, the disclosure relates to improvements to super-regenerative resonator architectures that allow low-power wireless receivers and transmitters, as well as improvements to the range of frequency of operation and the frequency stability of oscillators.

Description of Related Art

The field of RF-MEMS has thus far improved many aspects of wireless communication, with great gains in reducing power-consumption and reducing size when compared to conventional technology. On-chip MEMS devices now provide applications from compact and low phase-noise reference oscillators to band-selecting RF front-end duplexers. Greater potential remains, however, if the high quality factor and CAD-definable frequency possible in MEMS can be harnessed to achieve a complete radio without the need for the power-hungry frequency mixing and wide-bandwidth analog to digital conversion used in modern RF architectures.

Because of the high Q-factors achievable in some resonators, a super-regenerative receiver made using such resonators offers not only the amplitude-shift keying (ASK) possible in conventional super-regenerative receivers, but also allows discrimination of frequency-shift keying (FSK), a key capability for modern digital communication systems. A previous patent application PCT/US2015/031251 describes a high Q-factor microelectromechanical systems (MEMS) based resonator which may be used for such applications. A previous patent application PCT/US2015/031589 describes a MEMS-based super-regenerative transceiver offering FSK decoding capability.

SUMMARY OF THE DISCLOSURE

The present disclosure describes improvements which permit a super-regenerative receiver to operate using many modern protocols that use FSK or On-Off Keying (OOK) modulation, including but not limited to Z-Wave or implementations of the Bluetooth or GSM standards. The present disclosure also describes an improved MEMS-based resonator for use in a super-regenerative receiver.

In addition to the protocols listed above, the present disclosure describes improvements which permit a super-regenerative receiver to be used in implementations of at least one or more of the following protocols: Zigbee, IEEE 802.15.4, SigFox, Helium, LORA, GPS, ANT+, NB-IoT, and Dash7.

Bluetooth, Bluetooth Low-Energy (BLE) and Z-Wave are protocols widely used in home and commercial automation as well as consumer wireless applications. Focused on low data-rates of 9.6 kbps to 40 kbps at 900 MHz, Z-Wave offers radio technology with both increased range when compared with 2.4 GHz protocols such as Zigbee, as well as simpler RF hardware and standards compliance. Indeed, the simple frequency-shift keying modulation and reasonable specs allows such transceivers to be implemented with little difficulty for use in home and industrial monitoring applications. The Bluetooth and BLE standards offer greater compatibility and more operating modes for a wide variety of consumer and other commercial applications, at the cost of somewhat increased complexity. Though designed for battery operated remote devices, current implementations of these standards typically consume a battery-unfriendly 15-50 mW or more, clearly far too much to operate for long on the small batteries needed to deploy the low-cost sensor motes envisioned in future ubiquitous IoT systems.

Power consumption remains an important consideration in the design of wireless transceivers. With the increase in the number of such transceivers used both for Internet of Things (IoT) applications, as well as consumer electronics, the desire for lower power operation is highly commercially relevant. By reducing component part count, and simplifying data communication complexity, power consumption may be lowered. In some embodiments of this disclosure, a radio frequency (RF) resonator is embedded in an active, controllable positive feedback loop to form a tunable RF channel-selecting radio transceiver employing a super-regenerative reception scheme. In some embodiments, in radios employing super-regenerative reception schemes, an amplifier combined in closed-loop feedback super-regeneratively amplifies input signal on resonance, allowing detection of weak radio signals without the need for complex, power-hungry architectures. In some embodiments, the resulting transceiver utilizes the high Q-factor (500-200, 000) and tunable frequency capabilities of some resonators (e.g., MEMS-based resonators) to enable direct selection of a single narrow RF channel in a broader band, as desired for low-power operation.

In some embodiments, use of one or more electrodes of the resonator as a signal input (e.g., from an antenna) with separate one or more electrodes for the super-regenerative gain affects a filtering that suppresses input signal feed-through, thereby allowing a cleaner filtered output. In some embodiments, differential signals are used to further suppress feed-through. Past super-regenerative receivers using conventional technology typically included two-port devices wired in feedback with an amplifier. This meant that the input signal had to be directly connected to the input of the amplifier, which results in anything entering the receiver system (e.g., from an antenna) to be amplified without any filtering whatsoever. If there are large interferers at frequencies other than the desired frequency (typical for radio applications), then such interferers cause major issues and often prevent reception. In some embodiments, with the multiple isolated electrodes possible using the disclosed resonator design, such inputs may be isolated from the amplifier, thus solving this problem.

The disclosed receivers, transmitters, and transceivers are well suited to wireless sensor node applications, where low-power consumption and reliability are critical. In some embodiments, controllable frequency tuning also allows the same device to operate as a frequency-shift keyed transmitter, or with simple switching of the output, an on-off keying transmitter, making a complete transceiver in one exceedingly simple device. In some embodiments, the geometric flexibility of resonator structure design permits a large range of usable RF frequencies, from 60 MHz VHF and lower frequencies, all the way up to UHF or above. For example, a bank of resonators, each designed for a particular range of frequencies, may be coupled by a switch network to one or more receiver antennas, and one or more feedback elements with optional one or more tuning elements, and optional one or more response sensing elements to create a receiver that may span a broad range of frequencies.

Embodiments of the present disclosure are directed to devices, systems, and methods of capturing symbol data from a wireless signal using an RF receiver having a resonator and a feedback element with variable gain. Implementations are directed to using the feedback element gain to control the frequency response of the resonator to improve receiver signal sensitivity or receiver data rates. Additional implementations are directed to tuning the resonator resonance frequency and expanding the receiver frequency range of operation using multiple resonators.

DETAILED DESCRIPTION

The present disclosure describes radio receiver, transmitter, and transceiver embodiments including a resonator (e.g., MEMS-based resonator) for use in home and industrial sensor/actuator modules or other wireless communication applications, in order to drastically lower power consumption to levels which allow continuous operation on coin cell batteries for periods of years. In some embodiments, disclosed devices employ a super-regenerative radio receiver architecture with a resonator (e.g., MEMS-based resonator) in order to provide simplicity of architecture—necessary for the required power reduction—and to allow sufficient frequency-selection in order to enable the FSK-based demodulation and nearby channel rejection needed to comply with modern protocol standards.

Because of the high Q-factors achievable in MEMS devices, a super-regenerative receiver made using such resonators offers not only the amplitude-shift keying possible in conventional super-regenerative receivers, but also allows discrimination of frequency-shift keying, a key capability for modern digital communication systems. Indeed, it is this ability that allows a MEMS-based radio to operate using the Bluetooth, BLE, Z-Wave, or other modern protocols.

In some embodiments, with quality factors (Q-factor) in the thousands even at GHz frequencies, resonators (e.g., MEMS-based resonators) described herein easily allow for tuning to the tightly-spaced kHz-frequency bands ideal for sensor nodes, without requiring the processing and power-hungry spread-spectrum approaches currently used. In some embodiments, power consumption of oscillators constructed from such resonators has been demonstrated below 100 µW, even in the face of modest resonator impedance in the kΩ-range. Such oscillators are ideally suited to the target wireless sensor node and battery-operated wireless relay mote applications, for which low-power consumption and reliability are critical.

Figure 1:
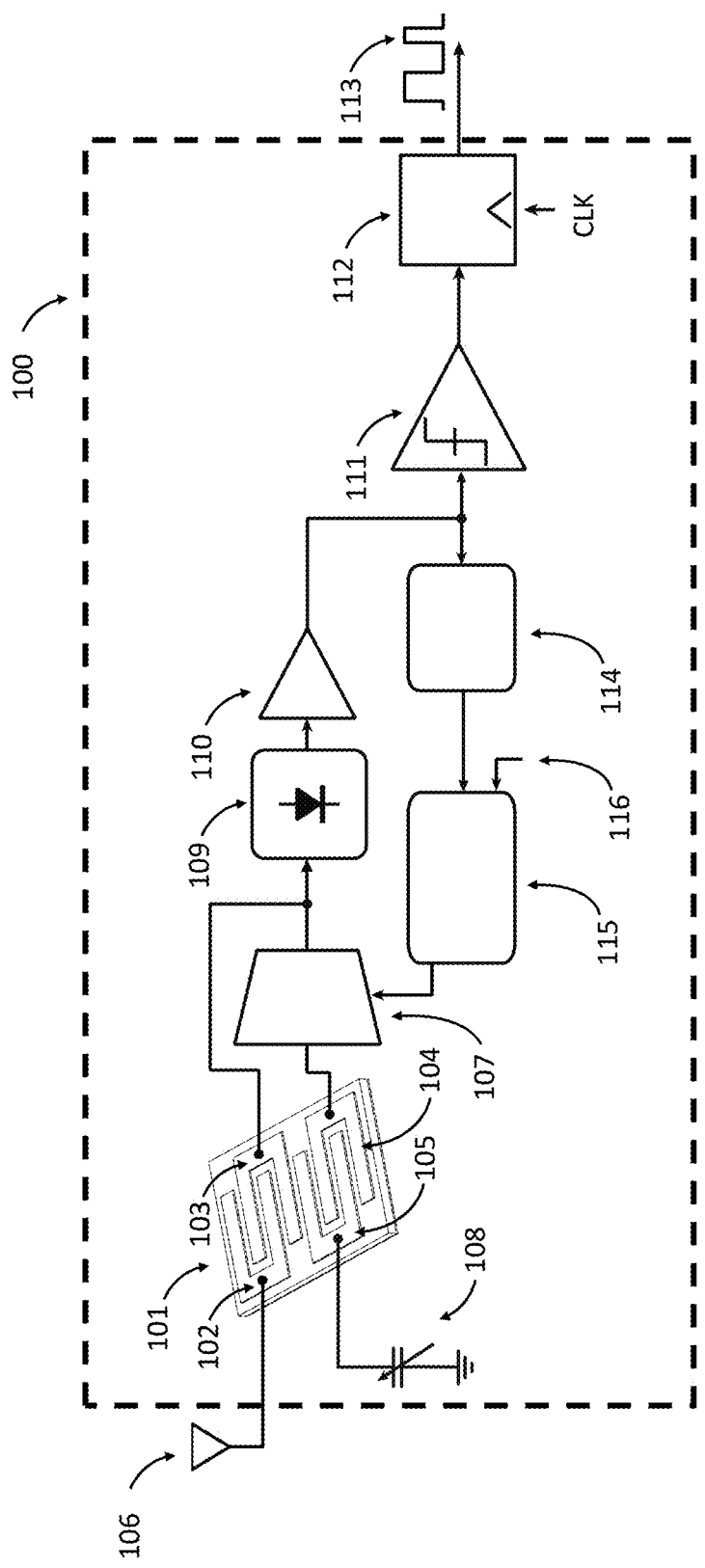
FIG. 1 illustrates an exemplary schematic of a super-regenerative MEMS-based receiver.

An exemplary schematic of a super-regenerative receiver is illustrated in FIG. 1. In an exemplary embodiment, a super-regenerative receiver 100 includes a resonator 101 (e.g., a piezoelectric transduced lamb-wave RF MEMS resonator) with electrodes 102, 103, 104, and 105. The receiver 100 receives a wireless signal (e.g., at 900 MHz) with FSK-encoded symbol data using an antenna 106 coupled to electrode 102. Electrodes 103 and 104 are coupled to a closed-loop feedback element 107, including a variable gain amplifier (not shown), to create a feedback loop. The resonance frequency of resonator 101 may be controlled by a tuning element 108, including a variable capacitor, coupled to electrode 105. An output of the closed-loop feedback element 107 is coupled to an envelope detector 109. The output of the envelope detector 109 is connected to an amplifier 110. The output of the amplifier 110 is connected to a comparator 111. The output of the comparator 111 is connected to an output flip-flop 112. The output of the output flip-flop 112 provides the demodulated symbol data 113 based on the received wireless signal. The output of the amplifier 110 is also connected to an average peak detector 114. The output of the average peak detector 114 is connected to a gain controller 115. A signal 116 from a clock specifying the timing of the symbol data is also connected to gain controller 115. The gain controller 115 controls the gain of the closed-loop feedback element 107 to capture the symbol data in the wireless signal.

In some embodiments, one or more of the envelope detector 109, the amplifier 110 or the average peak detector 114 together form a response sensing element. In some embodiments, the gain controller 115 uses the input from the average peak detector 114 to adjust the gain of the closed-loop feedback element 107 to account for the amplitude of the received wireless signal (e.g., depending on the distance between the receiver 100 and the transmitter (not shown) or the transmitter power). As described below, the gain controller 115 adjusts the gain of the closed-loop feedback element 107 one or more times during a period of a single symbol to capture the symbol data. In some embodiments, the receiver 100 may comprise a die with the resonator 101 electrically connected (e.g., using wire bonds) to one or more die with the remaining elements. In some embodiments, the receiver 100 may comprise a die with resonator 101 and one or more elements with the remaining elements on one or more other die. In some embodiments, one or more of a feedback element, a tuning element, or a response sensing element may include components in common. In some embodiments, additional components (e.g., an amplifier, a filter) may be a part of a feedback element, a tuning element, or a response sensing element which, in turn, are then coupled to a resonator.

Using an exemplary embodiment of a super-regenerative receiver, FIG. 2A illustrates an exemplary wireless FSK signal 201 received by the super-regenerative receiver. Illustrated in FIG. 2B, a feedback element coupled to a resonator in the super-regenerative receiver varies its gain 202 as shown during each period of a single symbol to capture the incoming data on the received wireless FSK signal 201. As illustrated in FIG. 2C, control signals 203 are used by the feedback element to vary the gain within each period of a single symbol (see FIG. 8 for description of $CLK_S$, $CLK_F$, $CLK_{IN}$, $CLK_{OUT}$, and $CLK_{CON}$). As illustrated in FIG. 2D, the super-regenerative receiver, at its core, identifies an incoming '1' or '0' by measuring the rate at which oscillations grow in response to a positive feedback from the feedback element (response of the resonator, shown as 204). In this embodiment, with the resonator turned to the frequency corresponding to a '1,' the absence of received antenna signal power in the resonance passband results in a slow rise in oscillation amplitude, which indicates a '0.' On the other hand, with received power on resonance, signal couples into the positive feedback loop, speeding up the rise time to indicate a '1.' The output of the super-regenerative receiver shows the received data 205, FIG. 2E, based on, in some embodiments, a thresholding of an envelope detector output (dashed line 206 shows threshold in FIG. 2D). Operated in such a fashion, this super-regenerative receiver forms a Binary Frequency-Shift Keying (BFSK) demodulator, where the FSK 'mark' ('1') and 'space' ('0') correspond to on and off-resonance signals, respectively.

In some embodiments, an envelope detector may be simple diode detectors, root-mean square circuit detectors, or active energy detectors. In some embodiments, in addition to detection of an output signal of the resonator, simple diode detectors, root-mean square circuit detectors, or active energy detectors may be used in a response sensing element (e.g., measuring resonator power, energy, oscillation amplitude) coupled to other components (e.g., feedback element, tuning element) in the super-regenerative receiver. In some embodiments, a tuning element may use the output of a response sensing element to adjust the resonance frequency of the resonator. In some embodiments, the tuning element may be incorporated as part of a feedback element. In some embodiments, a feedback element may use the output of a response sensing element to control the gain when coupled to a resonator. In some embodiments, the feedback element uses an indication of the power signal measured by the response sensing element to implement gain control capability to optimize reception. For example, as the distance between a wireless transmitter and a wireless receiver is decreased, the received RF power at the wireless receiver is increased and, hence, the gain of the feedback element (to ensure signal detection and measurement) may be decreased. Similarly, if the transmitting power of the wireless transmitter is increased, the received RF power at the wireless receiver is increased and, hence, the gain of the feedback element may be decreased.

In some embodiments using a high Q-factor MEMS-based resonator, the super-regenerative receiver isolates a single narrow channel while rejecting signals in the nearby spectrum. The isolation is made possible based on the input to the feedback element being isolated from the input antenna by virtue of only on-resonance signals being passed through the high Q-factor MEMS-based resonator; out-of-channel interferers are blocked by the frequency response of the high Q-factor MEMS-based resonator. The disclosed embodiments mark a significant improvement over previous super-regenerative receiver architectures where loop amplifiers must handle any spurious signal received by the input antenna without causing excess intermodulation. In some embodiments using a high Q-factor MEMS-based resonator, the filtering of any such interferers greatly relaxes the linearity and, hence, power consumption of the receiver.

Sustaining Amplifier Design

Figure 18:
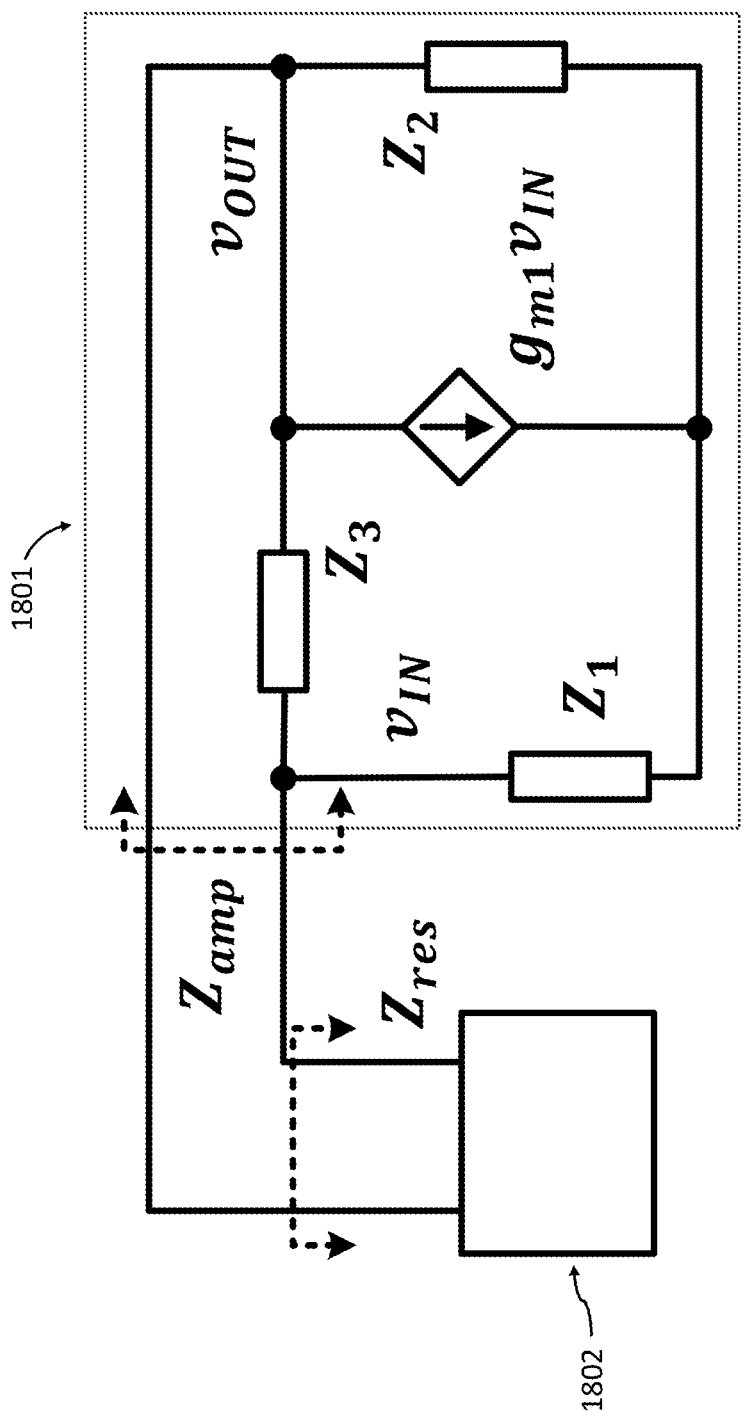
FIG. 18 illustrates an exemplary circuit diagram for a simplified model of an amplifier coupled to a resonator.

For super-regenerative oscillation to occur in any resonator-amplifier system, two conditions must hold: 1) the total closed-loop phase shift must be zero; and 2) the loop gain must be larger than unity. During oscillation start-up, oscillation amplitude is small—initially constituting of only noise—and the whole system stays linear. Therefore, the oscillator may be modeled using small-signal equivalent circuits such as that of one possible embodiment presented in FIG. 18. One way to understand such oscillators is using an impedance approach. In this approach, the critical condition for oscillation occurs when:

$$Zamp - Zres = 0 \quad (1)$$

where Zamp and Zres are the impedance looking at the amplifier 1801 and resonator 1802, respectively. This model holds broadly for many embodiments of resonators and amplifiers (as used herein, "feedback element" is used to describe an amplifier generally, including the two embodiments of a closed-loop feedback element and a controlled impedance element described below). This condition can be further split into real and imaginary components:

$$-Re[Zamp] = Re[Zres] \quad (2)$$

$$-Im[Zamp] = Im[Zres] \quad (3)$$

Here, the real component requires that the effective resistance looking into the amplifier be negative (gain) to compensate the positive resistance (loss) of the resonator; while the imaginary component sets the phase shift at oscillation. This simple impedance-based approach provides a versatile framework which can be useful in describing many embodiments of such systems, as long as an equivalent impedance can be defined for the resonator and the feedback element.

Figure 8:
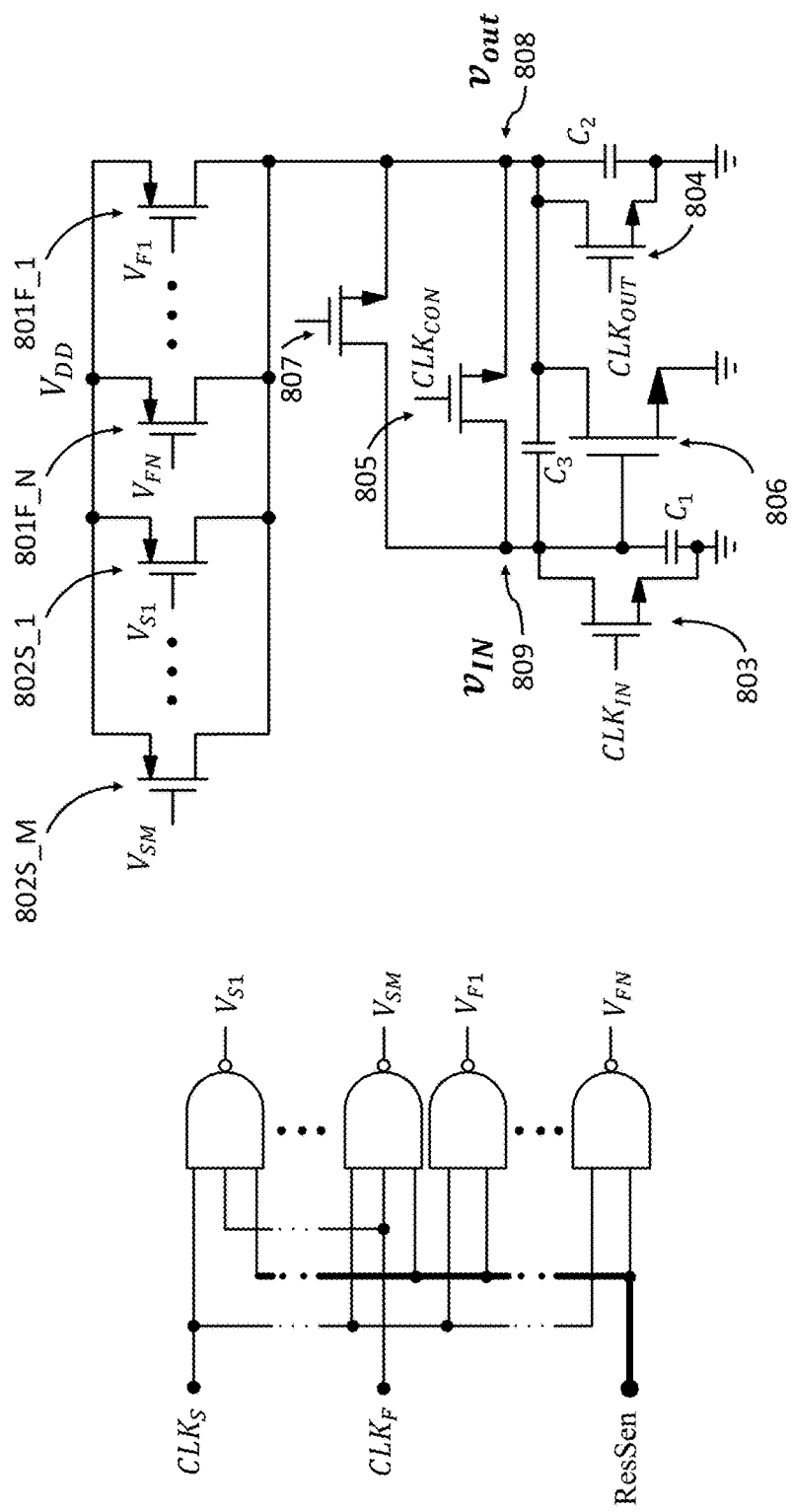
FIG. 8 illustrates an exemplary circuit diagram for a closed-loop feedback element.

In one embodiment, a closed-loop feedback element in a pierce configuration shown in FIG. 8, the first oscillation condition is achieved by transistor 806 which introduces 180° of phase shift between the input 809 and output 808 voltages. At resonance, the phase shift across the lamb-wave resonators shown in one embodiment here is 0°, so an additional 180° is needed to satisfy criterion 2. To supply this, the resonator (not shown) must operate in the inductive region, i.e., with frequency slightly above that of the series resonance, and resonate with $C_1$, $C_2$, and $C_3$, which comprise the total parasitic capacitance from the resonator, the amplifier, and surrounding structures (e.g., bond pads) at the input 809 and output 808 nodes.

The minimum (or critical) small signal transconductance gain for oscillation to start then takes the form:

$$g_{m1,crit} \approx \omega_0^2 R_x (C_{1,2} + 2C_3)^2 \quad (4)$$

where $C_{1,2} = C_1 = C_2$. When the gain is sufficient to overcome resonator losses, i.e., loop gain >1, the oscillator loop amplitude rises exponentially with time constant given by:

$$\tau = -\frac{2L_x}{R_x(1-T)} \quad (5)$$

where $R_x$ and $L_x$ are the equivalent circuit model elements for the resonator tank (equivalent LRC circuit) and T is the loop gain. For the pierce and negative resistance amplifier topology examples below, T=−Ramp/Rx, where Ramp and Rx are the real components of Zamp and Zres, respectively. Rx here is a positive value, while Ramp is negative (representing the gain of the feedback element). Note, however, that this is not the only possible definition of loop gain, and for other amplifier topologies or models, this loop gain may be defined otherwise, as it represents a dimensionless constant equivalent to the total gain of resonator+amplifier, howsoever it may be implemented.

In this disclosure, the loop gain definition based on Ramp and Rx applies for both the closed-loop feedback element and the controlled impedance element embodiments, in both single-ended and differential versions. This provides a generalized form for loop gain in such systems, regardless of the specific amplifier topology chosen (e.g., pierce, transimpedance, negative-resistance, etc.). Here, loop gain for a closed-loop feedback element configuration is clear: the gain measured in a closed loop including both the feedback element and the equivalent resonator circuit model. For the controlled impedance element configuration, the above definition of loop gain is still an accurate description, with the understanding that the 'loop' here is the combination of the resonator equivalent circuit response, combined with the response of the controlled impedance element. In such a model, the controlled impedance element may be viewed as a transfer function between voltage at the controlled impedance element node connected to the resonator, to resultant current produced at that controlled impedance element node (or vice versa). For a negative resistance amplifier configuration, for example, the circuit produces a greater ac current than would be affected if the controlled impedance element node was merely connected to ground. In essence, this transfer function 'closes' the loop with the resonator response, allowing a loop gain to be defined, and, in the case of a controlled impedance element designed such that loop gain may be greater than 1, allows growing oscillation.

In aggregate effect, disclosed feedback element+resonator combinations work as a linewidth-controllable (here "linewidth" references resonator frequency response shape) resonator for loop gains anywhere between 0 (e.g., the unaltered, natural loss of the resonator (e.g., with amplifier disconnected)) to just under loop gain of one. In some embodiments, loop gain greater than zero but less than one is used during the frequency response shaping segment (e.g., 302, 312, 322 of the super-regenerative cycle in FIG. 3) to adjust the frequency response shape of a resonator. When loop gain is increased above 1 (e.g., during the symbol data capture segment), the device no longer operates as a resonator, but instead operates as a self-sustaining oscillator. The resonator signal then grows with each oscillation period till the receiver enters the conditioning segment, or until non-linearities in the resonator-feedback element loop cause self-limiting. Here, for loop gain >1, an on-resonance signal reduces the time required to rise to the threshold amplitude in two ways: first, the drive is resonantly enhanced to produce a resonator starting amplitude much larger than the background thermal noise, and second, this input signal continues to drive the resonator as oscillation grows, causing further increase in amplitude during oscillation startup beyond that provided purely by the feedback element-driven response.

As with any filter, the bandwidth of the filter limits the possible data transmission rate. Here, such a limit is enacted by the decay time required for the resonator to reach a low amplitude of motion following reception of an on-frequency symbol. If the feedback element conditioning segment duration falls short of the decay time of the resonator and the frequency response shaping segment is omitted, setting loop gain >1 (e.g., during the symbol data capture segment) will quickly restart oscillations even in the absence of an on-frequency input signal, e.g., may lead to an off-frequency input single (e.g., a '0' bit) to be counted as an on-frequency input signal (e.g., a '1' bit). In some embodiments, the disclosed frequency response shaping approach of FIG. 3 serves to not only increase mark versus space discrimination, but also helps filter out off-frequency input signal due to the steeper resonator response roll-off with frequency offset during the frequency response shaping segment, thereby improving signal sensitivity.

After the resonator has received and captured an on-frequency symbol, setting amplifier gain equal to zero (e.g., during the conditioning segment) leads to resonator oscillations decaying with time constant equal to the resonator's intrinsic damping. In order to speed up this decay yet further and more quickly prepare the resonator for the next capture period, the resonator oscillations may be attenuated more quickly by setting the loop gain below zero (e.g., introducing a dissipative element (e.g., resistive element) into the resonator+feedback element system). In some embodiments, the resonator oscillations are attenuated more quickly during the conditioning segment by shorting one or more resonator electrodes to ground or other DC source (e.g., the positive power supply) through a resistive element. This corresponds to a negative loop gain. In some embodiments, the use of negative feedback by applying an amplified signal out of phase with the resonator may also produce faster attenuation of the resonator oscillations.

In some embodiments, a super-regenerative receiver varies a gain of a feedback element during each period of a single symbol, see for example, FIGS. 3A-C. In some embodiments, the feedback element gain is changed over three time segments within a single period of a single symbol—the conditioning segment, the frequency response shaping segment, and the symbol data capture segment. As used herein, the names of these segments do not preclude different receiver actions occurring during different segments based on receiver design (e.g., capture during the frequency response shaping segment, frequency response shaping during the conditioning segment). As used herein, "capture period" refers to the period of time spanning a conditioning time segment (if not omitted) followed by a frequency response shaping time segment followed by a symbol data capture time segment. In some embodiments, during the conditioning segment, the feedback element gain is controlled to reset the resonator, e.g., attenuate oscillations of the resonator (e.g., from the previous symbol data capture state). The conditioning segment may improve sensitivity of measuring a '0' bit immediately following a '1' bit by attenuating the on-resonance oscillations generated by the '1' bit data during the previous period of a single symbol before measuring the '0' bit data in the current period of a single symbol. In some embodiments, the conditioning of the resonator may include damping the oscillations of the resonator by drawing power away from the resonator, e.g., by adding a dissipative element (e.g., a resistor, introducing a viscous fluid (e.g., viscous gas) in the environment of a MEMS-based resonator) to the resonator. In some embodiments, the conditioning of the resonator may include decoupling the feedback element from the resonator (described herein as setting the gain of the feedback element to zero, and allowing the resonator to dampen at its natural rate). In some embodiments, the conditioning of the resonator may include grounding, through a resistive element, one or more electrodes to which the feedback element is connected (described herein as setting the gain of the feedback element to a negative value). In some embodiments, the conditioning of the resonator may include connecting together, via a resistive element, two or more electrodes to which the feedback element is connected (described herein as setting the gain of the feedback element to a negative value).

In some embodiments, the feedback element gain is fixed during the conditioning segment. In some embodiments, the feedback element gain varies during the conditioning segment. Shorter duration for the conditioning segment permits more time to capture the input signal, thus increasing sensitivity or data rate. In some embodiments, the conditioning segment may be short compared to the period of a single symbol (e.g., conditioning segment time <about 1%, 5%, 10%, 25%, or 50% of the period of a single symbol). In some embodiments, the conditioning segment may be short compared to the capture period (e.g., conditioning segment time <about 1%, 5%, 10%, 25%, or 50% of the capture period). In some embodiments, the conditioning segment may be eliminated.

In some embodiments, during the frequency response shaping segment, the feedback element gain is controlled to improve the frequency response of the resonator, e.g., increasing the frequency sensitivity of the resonator, increasing the Q-factor of the resonator. In some embodiments, during the frequency response shaping segment, the frequency response of the resonator is improved by increasing the feedback element gain (e.g., relative to the feedback element gain during the condition segment). In some embodiments, the frequency response of the resonator is improved by increasing the feedback element gain in a single step during the during the frequency response shaping segment—see, for example, FIG. 3A. In some embodiments, the frequency response of the resonator is improved by increasing the feedback element gain in a step-wise manner over two or more steps during the during the frequency response shaping segment—see, for example, FIG. 3B. In some embodiments, the frequency response of the resonator is improved by continuously increasing the feedback element gain during the frequency response shaping segment—see, for example, FIG. 3C. In some embodiments, the frequency response of the resonator is improved by increasing the feedback element gain in a step-wise manner over one or more steps followed by continuously increasing the feedback element gain, or vice versa (i.e., continuously increasing followed by a step-wise increase), during the frequency response shaping segment. In some embodiments, the frequency response shaping segment may be long compared to the period of a single symbol (e.g., frequency response shaping segment time >about 1%, 5%, 10%, 25%, or 50% of the period of a single symbol). In some embodiments, the frequency response shaping segment may be long compared to the capture period (e.g., frequency response shaping segment time >about 1%, 5%, 10%, 25%, or 50% of the capture period).

In some embodiments, during the symbol data capture segment, the feedback element gain is configured to cause the resonator amplitude to rise exponentially irrespective of oscillation frequency (e.g., loop gain >1). In some embodiments, the feedback element gain is controlled to produce a loop gain equal to or greater than 1 during the symbol data capture segment. In some embodiments, the resonator output amplitude begins to rise exponentially for values of the feedback element gain equal to or larger than a critical gain value, and the feedback element gain is controlled to be equal to or greater than the critical gain value during the symbol data capture segment. In some embodiments, the feedback element gain is fixed during the symbol data capture segment. In some embodiments, the feedback element gain varies during the symbol data capture segment. In some embodiments, the symbol data capture segment may be long compared to the period of a single symbol (e.g., symbol data capture segment time >about 1%, 5%, 10%, 25%, 50%, 75%, or 90% of the period of a single symbol). In some embodiments, the symbol data capture segment may be long compared to the capture period (e.g., symbol data capture segment time >about 1%, 5%, 10%, 25%, 50%, 75%, or 90% of the capture period).

Figure 4:
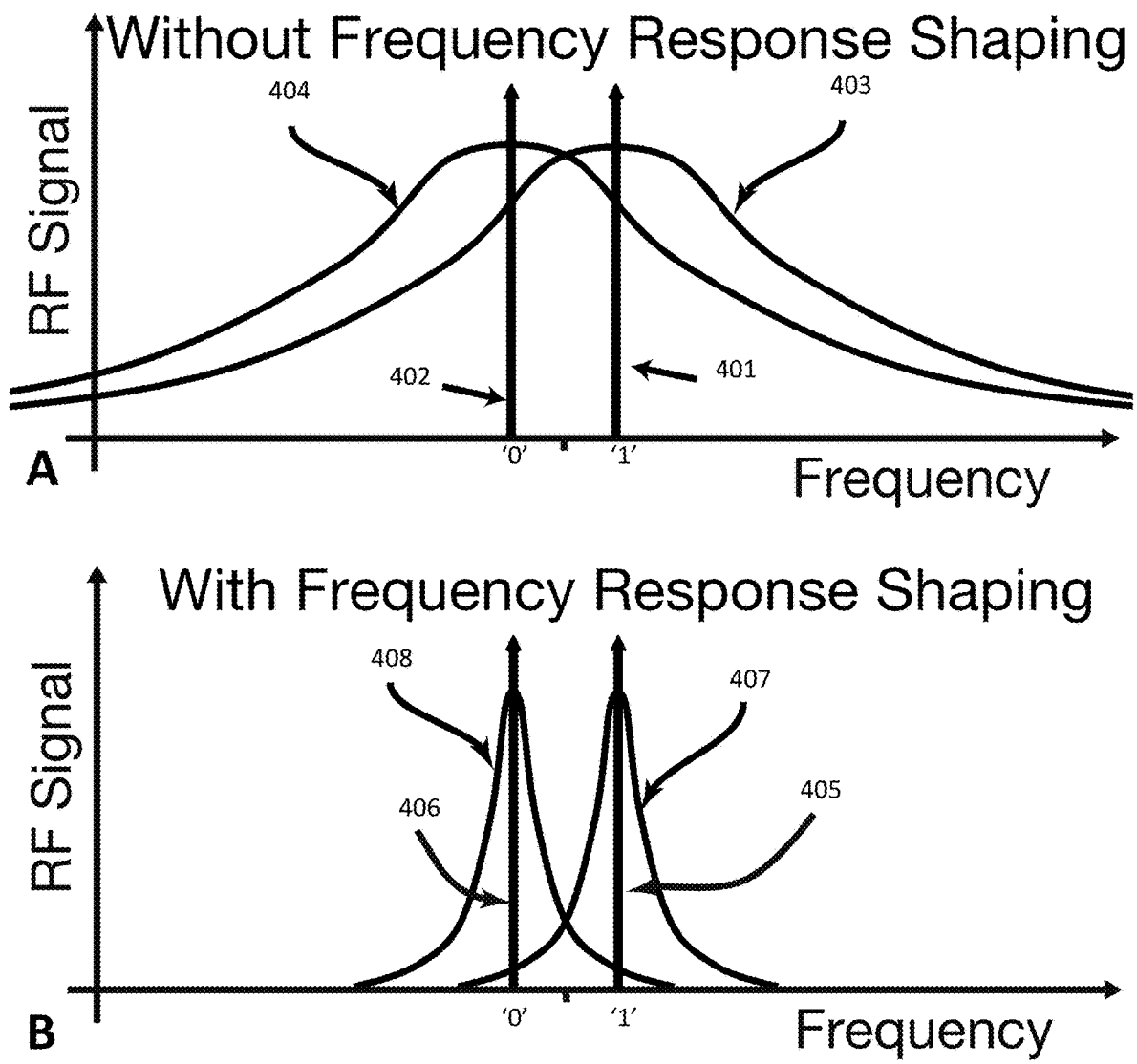
FIGS. 4A and 4B show the exemplary response of two resonators with and without frequency response shaping implemented by a feedback element.

FIG. 4A illustrates exemplary frequency response 403 of resonator 401, set to a '1' mark frequency, and exemplary frequency response 404 of resonator 402, set to a '0' space frequency. In this configuration, the incoming wireless FSK signal corresponding to a '0' will lead to resonator 401 response due to the wide frequency response 403 of resonator 401. Similarly, the incoming wireless FSK signal corresponding to a '1' will lead to resonator 402 response due to the wide frequency response 404 of resonator 402. If the frequency response shaping segment is omitted (frequency response 403 or 404 left unmodified) and the feedback element gain is set to a gain corresponding to the symbol data capture segment, the resulting response of either resonator 401 or 402 will lead to increased likelihood of errors by which a '0' incoming bit is mis-identified as a '1' by resonator 401 or a '1' incoming bit is mis-identified as a '0' by resonator 402.

FIG. 4B illustrates exemplary frequency response 407 of a resonator 405, set to a '1' mark frequency, and exemplary frequency response 408 of a resonator 406, set to a '0' space frequency. In this configuration, the incoming wireless FSK signal corresponding to a '0' will lead to reduced response (compared to resonator 401 in the configuration in FIG. 4A) of resonator 405 due to the narrow frequency response 407 of resonator 405. Similarly, the incoming wireless FSK signal corresponding to a '1' will lead to reduced response (compared to resonator 402 in the configuration in FIG. 4A) of resonator 406 due to the narrow frequency response 408 of resonator 406. With the frequency response shaping segment included during the capture of symbol data, the frequency response of the resonator narrows (e.g., from 403 to 407, from 404 to 408) and the increased attenuation of resonator response resulting from off-frequency input during the frequency response shaping segment leads to better discrimination between the incoming bits during the symbol data capture segment. In some embodiments, the Q-factor of the resonator may vary from a typical value of around 1,000 during the conditioning segment to a typical value of around 20,000 during the frequency response shaping segment. In some embodiments, the Q-factor of the resonator may vary from a typical value of around 10 during the conditioning segment to a typical value of around 1,000 during the frequency response shaping segment. In some embodiments, the Q-factor of the resonator may vary from a typical value of around 100,000 during the conditioning segment to a typical value of around 1,000,000 during the frequency response shaping segment.

FIG. 3A shows the gain (304, solid black), in one exemplary embodiment, of a feedback element coupled to a super-regenerative receiver and the response (305, solid grey) of a resonator in the super-regenerative receiver as a function of time over two periods of incoming single symbol data. In FIG. 3A, the gain 304 of the feedback element is fixed during each of the conditioning 301, frequency response shaping 302, and symbol data capture 303 segments. The gain 304 of the feedback element is controlled to change from a first value during the conditioning segment 301, to an intermediate second value during the frequency response shaping segment 302, and to a third value during the symbol data capture segment 303. In some embodiments, a critical value of the gain (306, dashed grey) may identify the gain above which the resonator exhibits super-regenerative oscillations. In some embodiments, the second value of the gain (during the frequency response shaping segment) may be arbitrarily close relative to the critical value of the gain 306. In some embodiments, the second value of the gain (during the frequency response shaping segment) may be lower than the critical value of the gain 306 based on the stability of the gain control in order to keep loop gain below 1.

FIG. 3B shows the gain (314, solid black), in one exemplary embodiment, of a feedback element coupled to a super-regenerative receiver and the response (315, solid grey) of a resonator in the super-regenerative receiver as a function of time over two periods of incoming single symbol data. In FIG. 3B, the gain of the feedback element is fixed during each of the conditioning 311 and symbol data capture 313 segments. The gain 314 of the feedback element changes between two fixed values during the frequency response shaping segment 312. The gain of the feedback element is controlled to change from a first value during the conditioning segment 311, to an intermediate second value during a first portion of the frequency response shaping segment 312, to an intermediate third value during a second portion of the frequency response shaping segment 312, and to a fourth value during the symbol data capture segment 313. In some embodiments, a critical value of the gain (316, dashed grey) may identify the gain above which the resonator exhibits super-regenerative oscillations.

FIG. 3C shows the gain (324, solid black), in one exemplary embodiment, of a feedback element coupled to a super-regenerative receiver and the response (325, solid grey) of a resonator in the super-regenerative receiver as a function of time over two periods of incoming single symbol data. In FIG. 3C, the gain of the feedback element is fixed during each of the conditioning 321 and symbol data capture 323 segments. The gain 324 of the feedback element changes continuously during the frequency response shaping segment 322. The gain of the feedback element is controlled to change from a first value during the conditioning segment 321, ramping from the first value to a second value during the frequency response shaping segment 322, and to a second value during the symbol data capture segment 323. In some embodiments, a critical value of the gain (326, dashed grey) may identify the gain above which the resonator exhibits super-regenerative oscillations.

Figure 2:
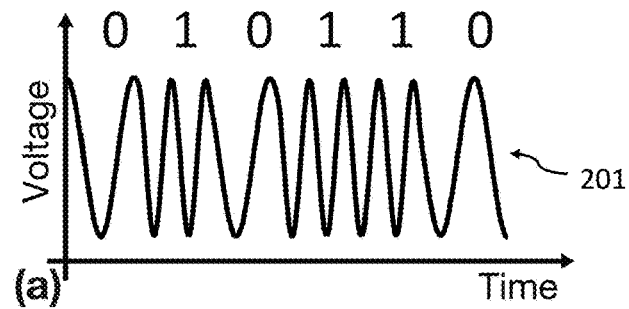
FIGS. 2A, 2B, 2C, 2D and 2E show exemplary time series diagrams of incoming wireless FSK signal, feedback element gain, feedback element control signals, response of the resonator, and captured data.
Figure 2:
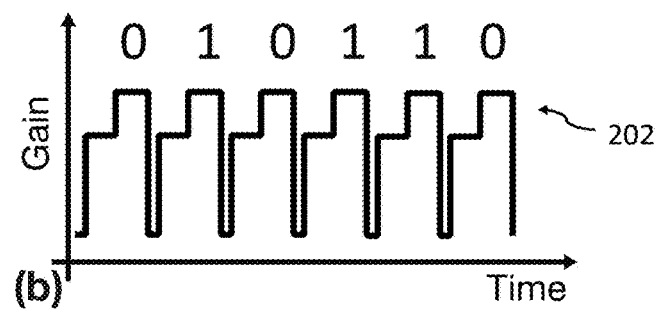
Figure 2:
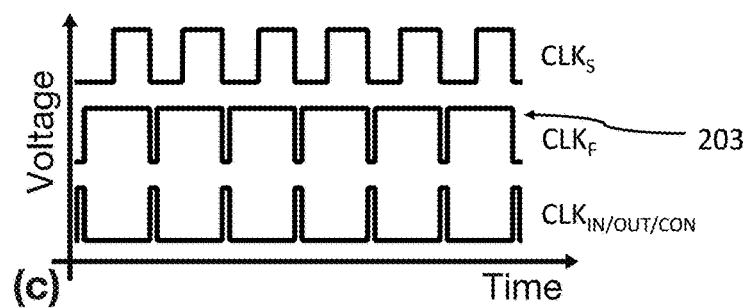
Figure 2:
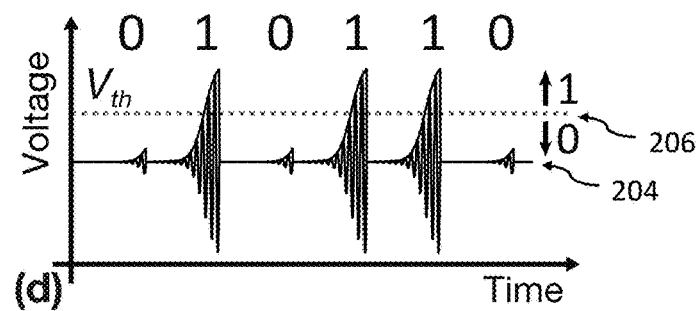
Figure 2:
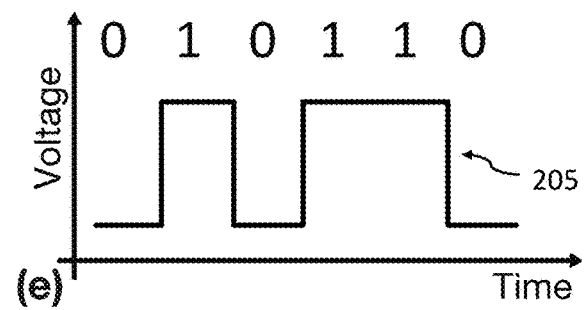
Figure 3:
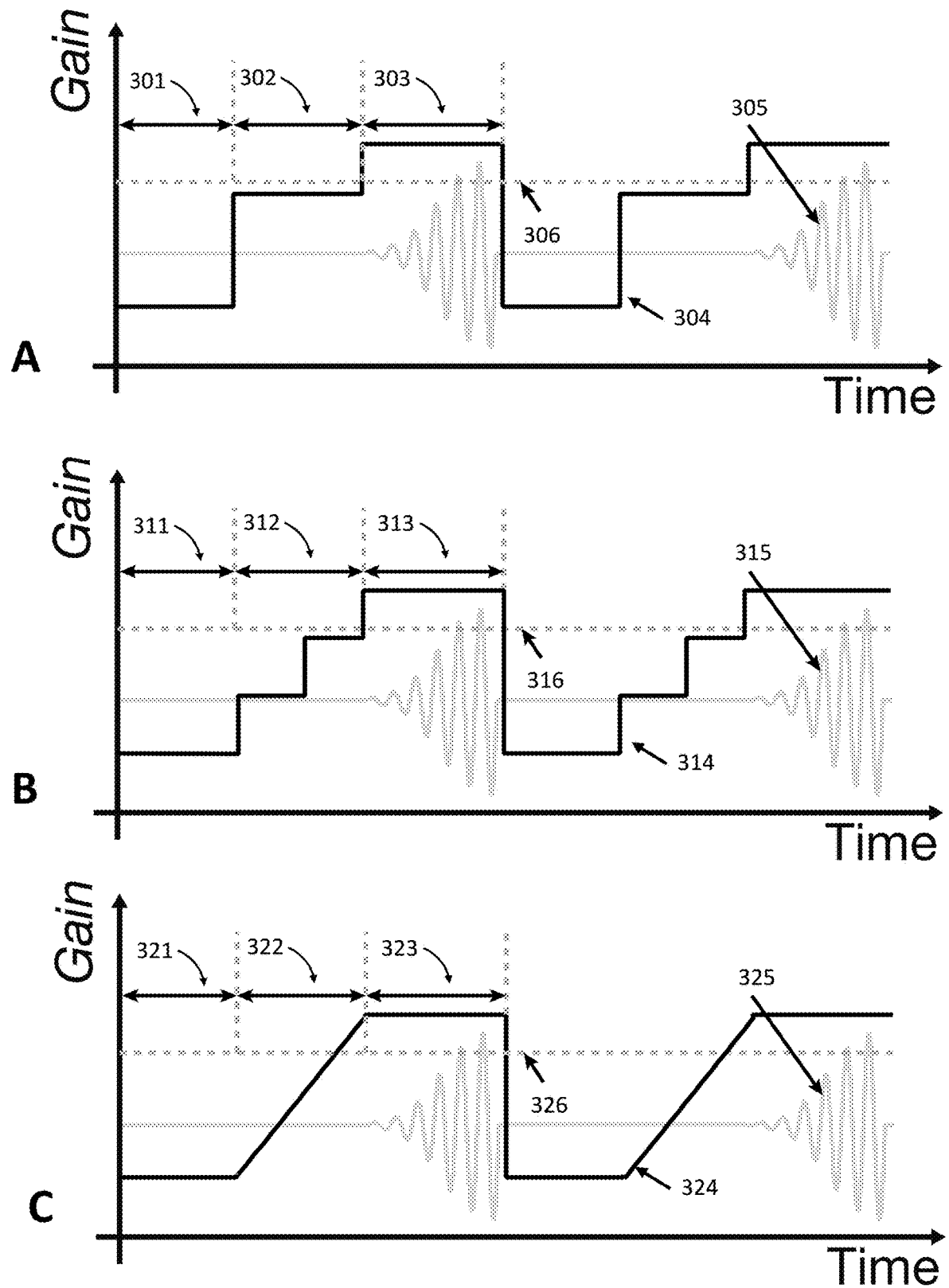
FIGS. 3A, 3B and 3C show three different time series diagrams of exemplary feedback element gain and the corresponding response of the resonator.

In some embodiments, a controller may configure the feedback element to capture the symbol data multiple times (e.g., more than one capture period) within a period of a single symbol. The traces in FIGS. 2 and 3 show exemplary embodiments in which a controller configures the feedback element to capture the symbol data once (one capture period) per period of a single symbol. In some embodiments, a controller may configure the feedback element to capture the symbol data two or more times (two or more capture periods) per period of a single symbol. For example, if a controller configures the feedback element to capture the symbol data twice per period of a single symbol, the feedback element may provide, over a first portion of the period of a single symbol, feedback to the resonator over a first conditioning segment, a first frequency response shaping segment, and a first symbol data capture segment. Over the remaining portion of the period of a single symbol, the feedback element may provide feedback to the resonator over a second conditioning segment, a second frequency response shaping segment, and a second symbol data capture segment. In some embodiments, the duration of each capture period may be the same during a period of a single symbol. In some embodiments, the duration of at least one capture period may differ from at least one other capture period during a period of a single symbol. In some embodiments, the feedback during each capture period may be the same for every capture period during a period of a single symbol. In some embodiments, the feedback during at least one capture period (e.g., single step in gain; see, for example, gain waveform in FIG. 3A) may be different from at least one other capture period (e.g., ramp in gain; see, for example, gain waveform in FIG. 3C) during a period of a single symbol. In some embodiments, the duration of a capture period or a duration of one or more segments defining the capture period (e.g., conditioning segment, frequency response shaping segment) may be determined based at least in part upon an output of a response sensing element. For example, the duration of a symbol data capture period may be based at least in part upon an output of a response sensing element (e.g., envelope detector), e.g., ending the symbol data capture segment when the resonator oscillation amplitude exceeds a certain threshold. In some embodiments, captured symbol data from each capture period in a period of a single symbol may be analyzed to determine the detected symbol value. For example, the median value of all capture symbol data from a period of a single symbol may be used as the detected symbol value for that particular period of a single symbol.

Figure 5:
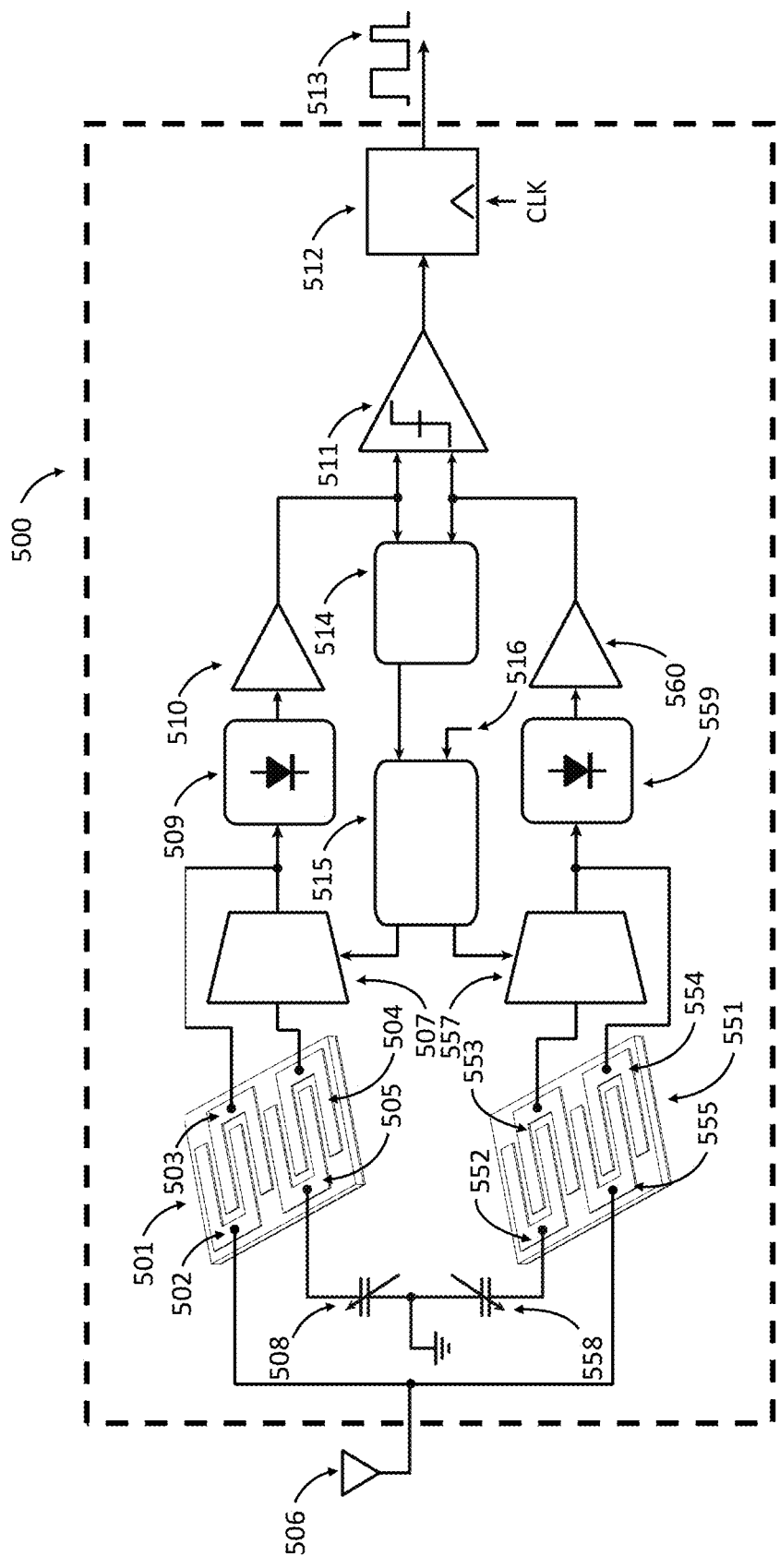
FIG. 5 illustrates an exemplary schematic of a super-regenerative MEMS-based receiver including dual resonators for capturing mark and space data.

In some embodiments, as shown in FIG. 5, an FSK signal may be decoded by a receiver 500 including two mirrored super-regenerative receivers with one resonator 501 tuned to detect frequency signals on-resonance for bit '0' ("space") and the other resonator 551 tuned to detect frequency signals on-resonance for bit '1' ("mark"). Resonator 501 includes electrodes 502, 503, 504, and 505. Resonator 551 includes electrodes 552, 553, 554, and 555. The receiver 500 receives a wireless signal (e.g., at 900 MHz) with FSK-encoded symbol data using antenna 506 coupled to electrode 502 of resonator 501 and coupled to electrode 555 of resonator 551. Electrodes 503 and 504 of resonator 501 are coupled to closed-loop feedback element 507, including a variable gain amplifier (not shown), to create a feedback loop. Electrodes 553 and 554 of resonator 551 are coupled to closed-loop feedback element 557, including a variable gain amplifier (not shown), to create a feedback loop. The resonance frequency of resonator 501 may be controlled by tuning element 508, including a variable capacitor, coupled to electrode 505. The resonance frequency of resonator 551 may be controlled by tuning element 558, including a variable capacitor, coupled to electrode 552. An output of closed-loop feedback element 507 is coupled to envelope detector 509. An output of closed-loop feedback element 557 is coupled to envelope detector 559. The output of the envelope detector 509 is connected to amplifier 510. The output of the envelope detector 559 is connected to amplifier 560. The output of amplifier 510 is connected to a first terminal of a comparator 511. The output of amplifier 560 is connected to a second terminal of the comparator 511. By comparing the signals from the mark and space receivers, the overall sensitivity is improved and some degree of common-mod rejection to noise is added. The output of the comparator 511 is connected to an output flip-flop 512. The output of the output flip-flop 512 provides the demodulated symbol data 513 based on the received wireless signal. The output of amplifier 510 and the output of amplifier 560 are also connected to an average peak detector 514. The output of the average peak detector 514 is connected to a gain controller 515. A signal 516 from a clock specifying the timing of the symbol data is also connected to gain controller 515. The gain controller 515 controls the gain of the closed-loop feedback element 507 to capture the symbol data in the data signal. The gain controller 515 also controls the gain of the closed-loop feedback element 557 to capture the symbol data in the data signal.

In some embodiments, to meet the requirements of a high Q-factor and narrow bandwidth requirements (e.g., ~40 kHz for Z-Wave FSK demodulation), a piezoelectric transduced lamb-wave MEMS-based resonator may be used. In some embodiments, the MEMS fabrication process used to fabricate such MEMS devices allows the flexibility to fabricate multiple MEMS devices targeting different frequencies on the same die by changing the CAD design (and, hence, the post-fabrication geometry) of the MEMS device. In some embodiments, the fabrication process used to fabricate the MEMS devices permits the fabrication of CMOS devices on the same die. In some embodiments, the MEMS device comprises a 2 um-thick AlN plate supported by two beams at nodal points with one or more electrodes (e.g., to be used as inputs or outputs to the resonator) coupled on the AlN plate. To drive the MEMS-based resonator into motion, an AC drive voltage is applied to an input electrode to produce a strain on the MEMS structure that, at resonance, excite the lamb wave mode shape. The resonance frequency is given by:

$$f_{nom} = \frac{1}{2W_f}\sqrt{\frac{E}{\rho}} \tag{6}$$

where $W_f$ is the spacing between any two fingers in all electrodes. E and $\rho$ are the Young's modulus and density of the AlN resonator plate (see, for example, FIGS. 1, 15, and 16). The MEMS-based resonator here may be modeled as a capacitor, an inductor, and a resistor in series, where the resonator mass, stiffness, and loss are equivalent to electrical capacitance, inductance, and resistance. The MEMS-based resonator electrodes provide coupling in this model via transformers, with each electrode forming a separate transformer to the equivalent tank circuit. This may be further simplified as an equivalent simple LRC circuit (without transformers) with effective resonator $L_x$, $R_x$, $C_x$ and resonance frequency:

$$f_{nom} = \frac{1}{2\pi\sqrt{L_x C_x}} \tag{7}$$

It can be appreciated in this electrical model, that for such resonators, resonance frequency may be tuned via additional shunt capacitance applied to a tuning electrode of the resonator. Effectively, this changes the effective capacitance of the resonator's tank, shifting the resonance frequency as in Eqn. 2. The frequency shift $\Delta f$ is governed by:

$$\frac{\Delta f}{f_{nom}} = \sqrt{1 + \frac{C_x}{C_{tot}}} - 1 \tag{8}$$

where $C_x$ is the motional capacitance of the resonator seen by the tuning electrode and $C_{tot}$ is the total capacitance at the tuning electrode. It can also be appreciated that this is not the only way to tune the resonance frequency of a MEMS-based resonator. Introduction of a variable inductance, via for instance an active inductor circuit, would likewise affect tuning, as would more elaborate turning methods via temperature or stress control, or mechanical effects provided from added voltage bias (e.g., DC voltage) to an element of a MEMS resonator. In some embodiments, the resonance frequency of a resonator may be tuned by at least one or more of: changing the capacitance of a capacitor coupled to the resonator, changing the inductance of an inductor coupled to the resonator, changing the mechanical stress in a resonator element (e.g., using temperature), or changing the mechanical geometry of the resonator (e.g., using an added DC voltage bias to one or more resonator elements).

TABLE 3

| | Resonator Design Parameters | | | Frequency Tuning and Amplifier Design Parameters | |
|---|---|---|---|---|---|
| Number of Electrodes | 4 | RF Frequency [MHz] | 908.4 | Max. Tuning Capacitance [pF] | 2 |
| Number of Fingers | 32 | Quality Factor | 1000 | Max. Tuning Frequency [ppm] | 1362 |
| Length [μm] | 100 | Motional Resistance [Ω] | 283.2 | Transconductance Gain [mS] | 1.14 |
| Width [μm] | 156.2 | Motional Capacitance [fF] | 0.619 | Power Consumption [μW] | 70 |
| AlN Thickness [μm] | 2 | Electrical Capacitance [fF] | 155.5 | Supply Voltage [V] | 1 |

Table 3 summarizes an exemplary resonator design, with calculated required power consumption of the amplifiers of only 70 μW.

In some embodiments, the temperature coefficients of different parts of the resonator and temperature coefficient differences between different parts of the resonator may lead to changes in the resonance frequency of the resonator as the resonator temperature changes. For example, as an uncompensated Aluminum Nitride resonator shows a typical temperature coefficient (TCF) of −20 to −30 ppm/° C., some form of compensation may be needed to meet the 27 ppm specification needed by the Z-Wave specification while operating over the full commercial temperature range 0° C. to 85° C. In some embodiments, an on-chip temperature measurement element combined with a tuning element may be used to tune the resonance frequency of the resonator to match the on-resonance frequency of the communication channel.

In order to achieve sufficient tuning to compensate the full commercial range, 2550 ppm (assuming −30 ppm/° C. of TCF over 85° C.) tuning is required. This requires two discrete resonators whose frequencies are separated by 1350 ppm (assuming some overlap in the operational frequency range of the two discrete resonators). In some embodiments, see Table 3, for frequency tuning less than 1350 ppm, tuning is affected via a 2 pF variable capacitance applied to the tuning electrode of the MEMS resonator(s). The 2 pF variable capacitor combines a digitally controlled capacitor bank with 5 fF unit capacitance and a 5 fF diode-based varactor. Conveniently, in some embodiments, this same capacitance tuning network allows the desired FSK modulation for transmit operation.

A feedback element used to implement a super-regenerative receiver, as disclosed herein, may be constructed in any number of ways. In some embodiments, a feedback element comprises a closed-loop feedback element having a controllable gain connected to two or more electrodes of a resonator. In some embodiments, a feedback element comprises a 1-port controlled impedance element connected to one or more electrodes of a resonator. In some embodiments, a controlled impedance element comprises a circuit element that presents an effective varying or fixed impedance at one of its ports. In some embodiments, a controlled impedance element may comprise a negative resistance amplifier. In some embodiments, a feedback element may be controlled to provide negative gain in order to dampen the oscillations of the resonator—for example, during the conditioning segment. In some embodiments, a feedback element may have controllable gain to produce a change in the frequency response of the resonator—for example, during the frequency response shaping segment. In some embodiments, a feedback element may be a circuit element that produces a frequency-dependent complex impedance. In some embodiments, a feedback element may be a circuit element that produces a variable gain (e.g., both positive and negative, having different magnitude) or variable phase shift.

Figure 6:
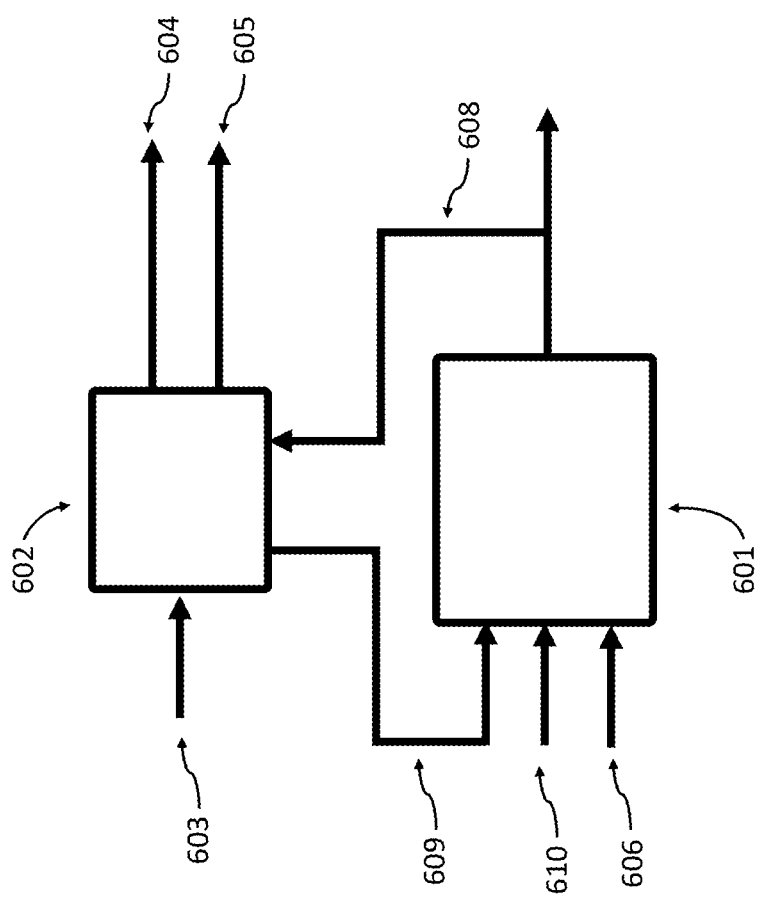
FIG. 6 illustrates an exemplary schematic for a closed-loop feedback element coupled to a resonator.

FIG. 6 illustrates an exemplary schematic of a closed-loop feedback element 601 coupled to two ports of resonator 602. In some embodiments, input port 603 of the resonator is coupled to a signal from an antenna (not shown). In some embodiments, port 604 of the resonator 602 is coupled to a tuning element (not shown). In some embodiments, the tuning element may include variable capacitance to adjust the resonance frequency of the resonator 602. In some embodiments, the tuning element may apply a voltage bias (e.g., DC voltage) to one or more elements of the resonator 602 to adjust the resonance frequency of the resonator 602. In some embodiments, port 605 of the resonator 602 is coupled to an input of a response sensing element (not shown). In some embodiments, an output of the response sensing element is coupled to input 606 of the closed-loop feedback element 601. In some embodiments, closed-loop feedback element 601 may use the input from the response sensing element to adjust the gain of the feedback loop (e.g., to account for the amplitude of the input signal from the antenna (e.g., based on proximity of the wireless signal transmitter)). The closed-loop feedback element 601 ports (608, 609) are each connected to one or more electrodes of the resonator 602. In some embodiments, input 610 of the closed-loop feedback element 601 is connected to one or more clock signals. The one or more clock signals, based on instructions from a controller, may control the gain of the closed-loop feedback element 601 during the period of a single symbol to generate a signal (e.g., from the resonator 602 (e.g., via port 608)) processed by other components (e.g., envelope detector, comparator, output flip-flop) as described herein.

Figure 7:
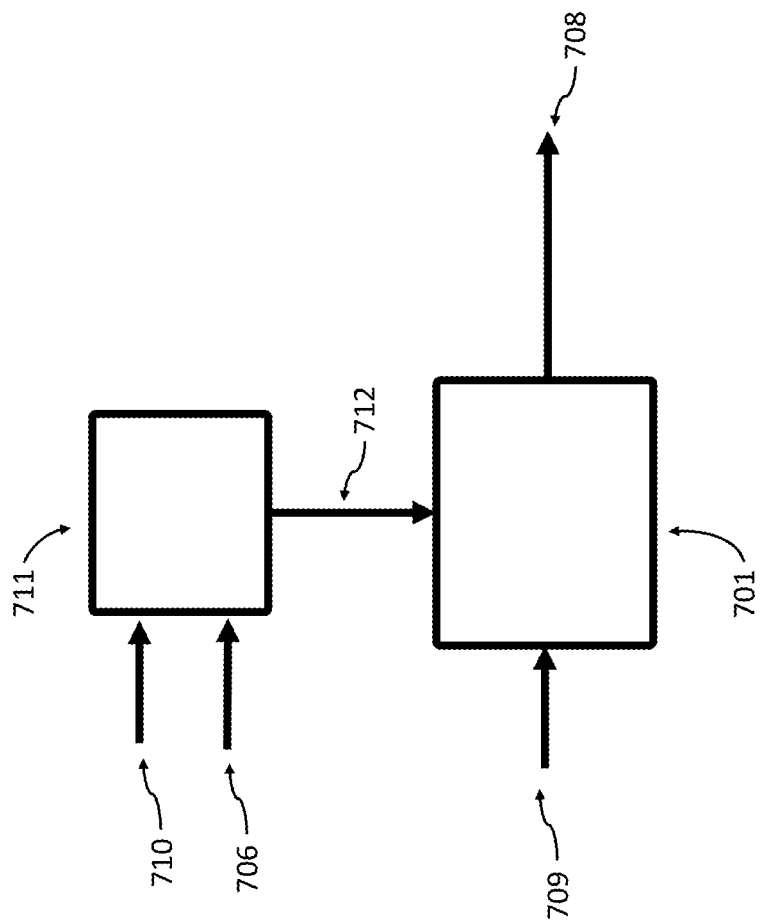
FIG. 7 illustrates an exemplary schematic for a control structure for a closed-loop feedback element.

FIG. 7 illustrates an exemplary schematic of a closed-loop feedback element 701 with feedback input port 709 and feedback output port 708 coupled to a resonator (not shown). In some embodiments, closed-loop feedback element 701 includes a control block 711. In some embodiments, the control block 711 includes input 710 receiving one or more clock signals. In some embodiments, the control block 711 includes input 706 receiving the output of a response sensing element (not shown). Output 712 of the control unit is provided to the closed-loop feedback element 701 to adjust the gain between the two ports (708, 709) of the feedback element 701.

FIG. 8 illustrates an exemplary circuit diagram for an implementation of a closed-loop feedback element with output 808 and input 809. The gain of the exemplary feedback element is controlled by the current from N transistors 801F_1 to 801F_N and M transistors 802S_1 to 802S_M. Voltage signals $V_{F1}$ to $V_{FN}$ connect to transistors 801F_1 to 801F_N in the control unit to adjust the current (and, hence, feedback element gain) during the frequency response shaping segment. Clock signal $CLK_F$ controls the timing for the frequency response shaping segment. Voltage signals $V_{S1}$ to $V_{SM}$ connect to transistors 802S_1 to 802S_M in the control unit to adjust the current (and, hence, feedback element gain) during the symbol data capture segment.

Clock signal $CLK_S$ controls the timing for the symbol data capture segment. ResSen signal, based at least in part upon an output of a response sensing element, is used to determine the gain during the capture period, including the gain during the frequency response shaping segment (e.g., controlling the number of transistors 801F_1 to 801F_N that turn on) and the gain during the symbol data capture segment (e.g., controlling the number of transistors 802S_1 to 802S_M that turn on), based on the resonator response (e.g., based on wireless signal strength). Clock signal $CLK_{IN}$ controls the transistor 803 to allow a controller to ground the input 809 (through a resistive element) of the feedback element (also grounding the corresponding one or more electrodes on the resonator through a resistive element and, hence, enabling increased attenuation of resonator oscillations). Clock signal $CLK_{OUT}$ controls the transistor 804 to allow a controller to ground the output 808 (through a resistive element) of the feedback element (also grounding the corresponding one or more electrodes on the resonator through a resistive element and, hence, enabling increased attenuation of resonator oscillations). Clock signal $CLK_{CON}$ controls the transistor 805 to allow a controller to tie the input 809 and output 808 of the feedback element together (through a resistive element; also tying together the corresponding one or more electrodes on the resonator through a resistive element and, hence, enabling increased attenuation of resonator oscillations). In some embodiments, one or more of transistors 803, 804, and 805 may be enabled during the conditioning segment to dampen the oscillations in the resonator. In some embodiments, one or more of transistors 803, 804 and 805 may include a designed-in resistance to act as the resistive element for dampening the resonator (e.g., 1 kohm, based on the channel of the MOSFET). Transistor 806 is the amplifier in the circuit. Transistor 807 is a bias transistor used to bias the output 808 and input 809 at the same voltage.

Figure 9:
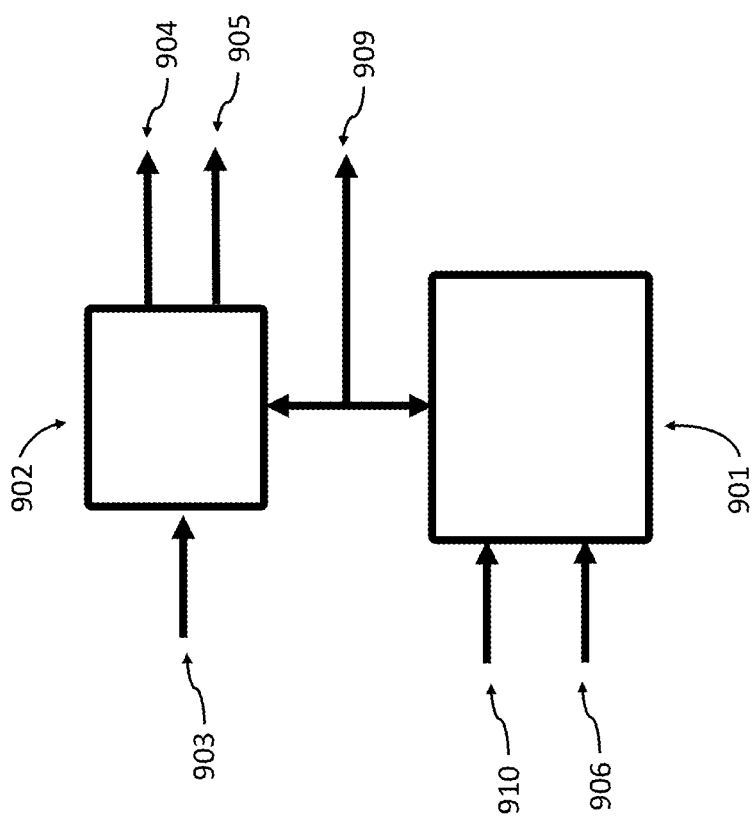
FIG. 9 illustrates an exemplary schematic for a controlled impedance element coupled to a resonator.

FIG. 9 illustrates an exemplary schematic of a feedback element comprising a 1-port controlled impedance element 901 with port 909 coupled to resonator 902. In some embodiments, input port 903 of the resonator 902 is coupled to a signal from an antenna (not shown). In some embodiments, port 904 of the resonator 902 is coupled to a tuning element (not shown). In some embodiments, the tuning element may include variable capacitance to adjust the resonance frequency of the resonator 902. In some embodiments, the tuning element may apply a voltage bias (e.g., DC voltage) to one or more elements of the resonator 902 to adjust the resonance frequency of the resonator 902. In some embodiments, port 905 of the resonator 902 is coupled to an input of a response sensing element (not shown). In some embodiments, an output of the response sensing element is coupled to input 906 of the controlled impedance element 901. In some embodiments, controlled impedance element 901 may use input 906 from the response sensing element to adjust the feedback gain by adjusting its impedance (e.g., to account for the amplitude of the input signal from the antenna (e.g., based on proximity of the wireless signal transmitter)). In some embodiments, input 910 of the controlled impedance element 901 is connected to one or more clock signals. The one or more clock signals, based on instructions from a controller, may control the feedback gain of the controlled impedance element 901 during the period of a single symbol to generate a signal (e.g., from the resonator 902 (e.g., via port 909)) processed by other components (e.g., envelope detector, comparator, output flip-flop) as described herein.

Figure 10:
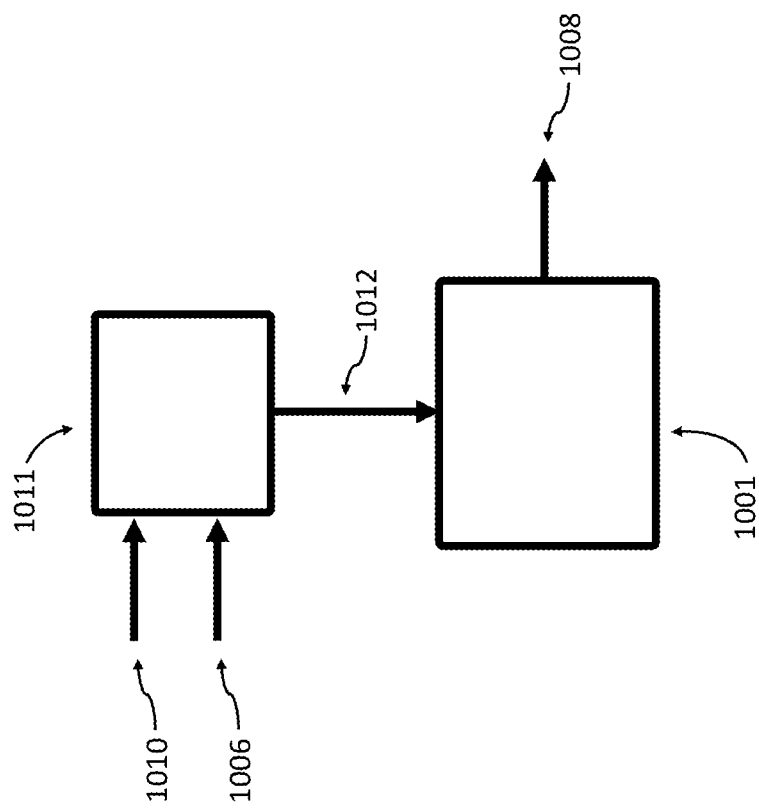
FIG. 10 illustrates an exemplary schematic for a control structure for a controlled impedance element.

FIG. 10 illustrates an exemplary schematic of a 1-port controlled impedance element 1001 with feedback port 1008 coupled to a resonator (not shown). In some embodiments, controlled impedance element 1001 includes control block 1011. In some embodiments, the control block 1011 includes input 1110 receiving one or more clock signals. In some embodiments, control block 1011 includes input 1006 receiving the output of a response sensing element (not shown). Output 1012 of the control unit is provided to the controlled impedance element 1001 to adjust the gain of the controlled impedance element 1001.

Figure 11:
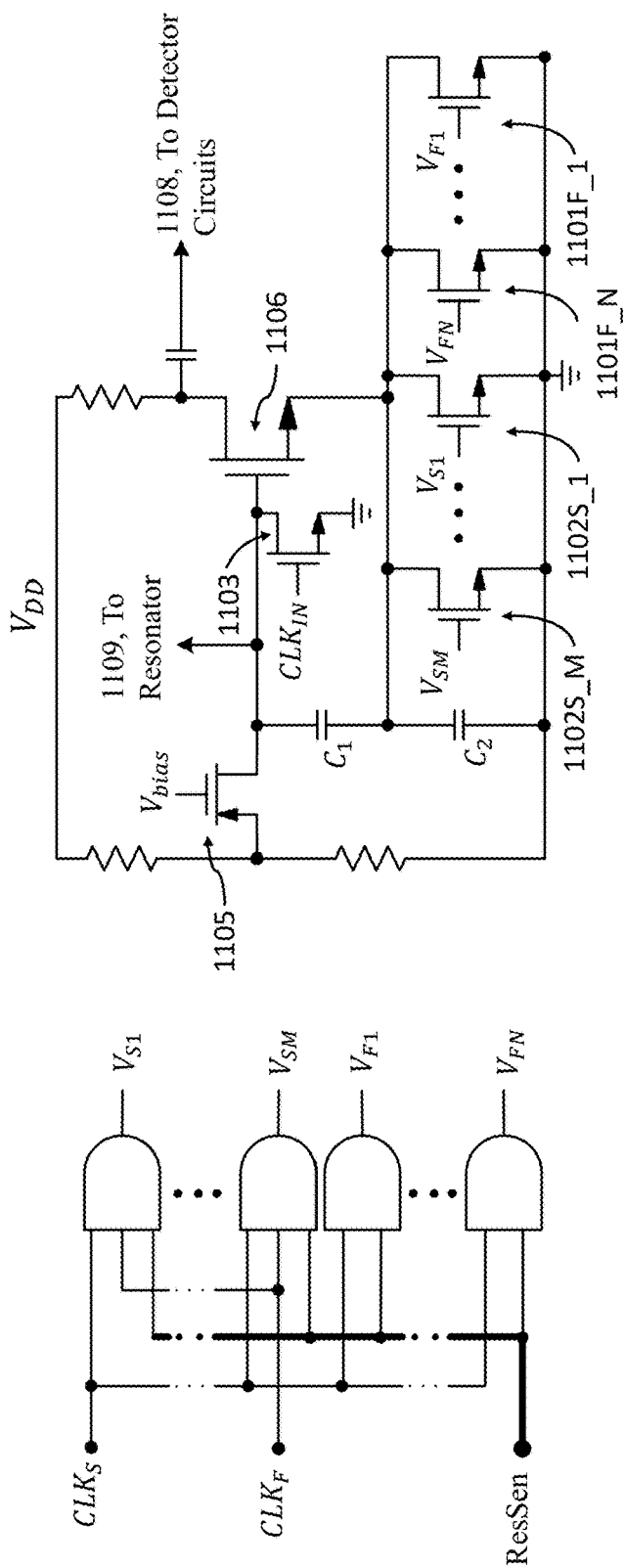
FIG. 11 illustrates an exemplary circuit diagram for a controlled impedance element.

FIG. 11 illustrates an exemplary circuit diagram for an implementation of a 1-port controlled impedance element with input 1109 (coupled to resonator (not shown)) and output 1108 (coupled to detectors (not shown)). In some embodiments, the input 1109 and output 1108 may be the same node in the controlled impedance element. The gain of the exemplary controlled impedance element is controlled by the current from N transistors 1101F_1 to 1101F_N and M transistors 1102S_1 to 1102S_M. Voltage signals $V_{F1}$ to $V_{FN}$ connect to transistors 1101F_1 to 1101F_N in the control unit to adjust the current (and, hence, feedback gain) during the frequency response shaping segment. Clock signal $CLK_F$ controls the timing for the frequency response shaping segment. Voltage signals $V_{S1}$ to $V_{SM}$ connect to transistors 1102S_1 to 1102S_M in the control unit to adjust the current (and, hence, feedback gain) during the symbol data capture segment. Clock signal $CLK_S$ controls the timing for the symbol data capture segment. ResSen signal, based at least in part upon an output of a response sensing element, is used to determine the gain during the capture period, including the gain during the frequency response shaping segment (e.g., controlling the number of transistors 1101F_1 to 1101F_N that turn on) and the gain during the symbol data capture segment (e.g., controlling the number of transistors 1102S_1 to 1102S_M that turn on), based on the resonator response. Clock signal $CLK_{IN}$ controls the transistor 1103 to allow a controller to ground the input 1109 (through a resistive element) of the controlled impedance element (also grounding the corresponding electrode on the resonator through a resistive element and, hence, enabling increased attenuation of resonator oscillations). Voltage $V_{bias}$ controls the transistor 1105 to properly bias the circuit for operation. In some embodiments, one or more of transistors 1103, and 1105 may be enabled during the conditioning segment to dampen the oscillations in the resonator. Transistor 1106 is the amplifier in the circuit.

Figure 19:
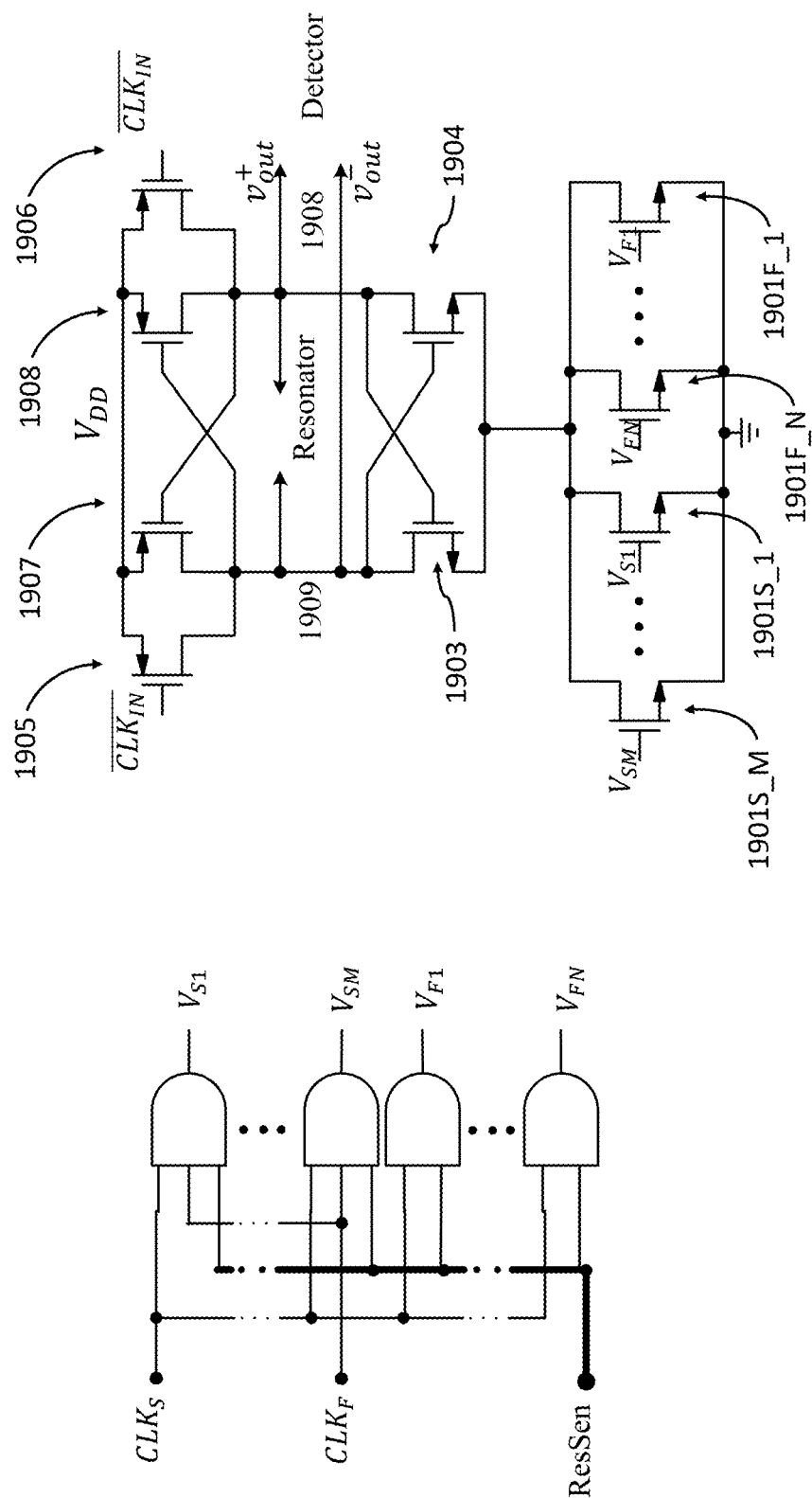
FIG. 19 illustrates an exemplary circuit diagram for a controlled impedance element using differential connections.

FIG. 19 illustrates an exemplary circuit diagram for an implementation of a 1-port controlled impedance element using differential connection with high input 1909 (coupled to resonator (not shown) input high and detector (not shown) input high) and low input 1908 (coupled to resonator input low and detector input low). The gain of the exemplary controlled impedance element is controlled by the current from N transistors 1901F_1 to 1901F_N and M transistors 1902S_1 to 1902S_M. Voltage signals $V_{F1}$ to $V_{FN}$ connect to transistors 1901F_1 to 1901F_N in the control unit to adjust the current (and, hence, feedback gain) during the frequency response shaping segment. Clock signal $CLK_F$ controls the timing for the frequency response shaping segment. Voltage signals $V_{S1}$ to $V_{SM}$ connect to transistors 1902S_1 to 1902S_M in the control unit to adjust the current (and, hence, feedback gain) during the symbol data capture segment. Clock signal $CLK_S$ controls the timing for the symbol data capture segment. ResSen signal, based at least in part upon an output of a response sensing element, is used to determine the gain the gain during the capture period, including the gain during the frequency response shaping segment (e.g., controlling the number of transistors 1901F_1 to 1901F_N that turn on) and the gain during the symbol data capture segment (e.g., controlling the number of transistors 1902S_1 to 1902S_M that turn on), based on the resonator response. Clock signal $CLK_{IN}$ controls the conditioning transistors 1905 and 1906 to allow a controller to short the inputs 1108 and 1109 (through a resistive element) of the controlled impedance element. In some embodiments, 1905 and 1906 may be enabled during the conditioning segment to dampen the oscillations in the resonator. Transistors 1903, 1904, 1907, and 1908 are gain transistors in the circuit.

Figure 12:
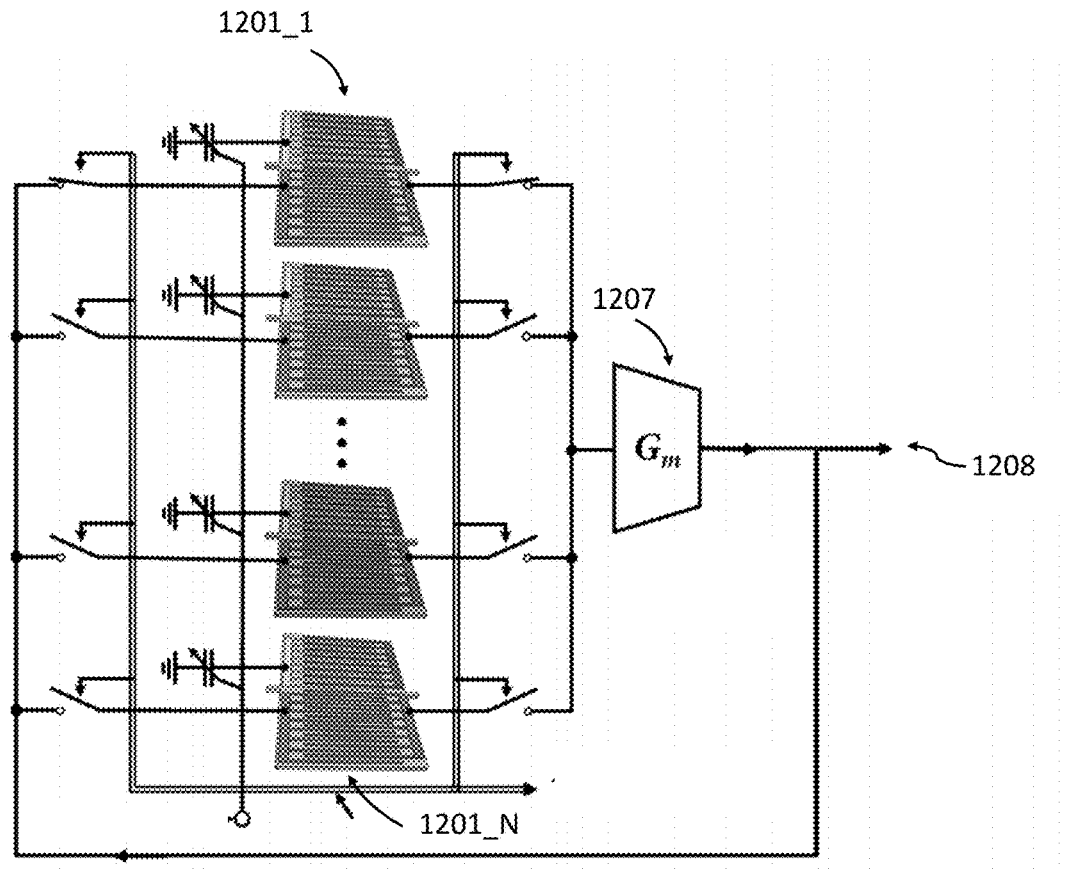
FIGS. 12A and 12B illustrate an exemplary schematic of a super-regenerative receiver including an array of resonators and the frequency sensitivity of resonators in the array of resonators, respectively.
Figure 12:
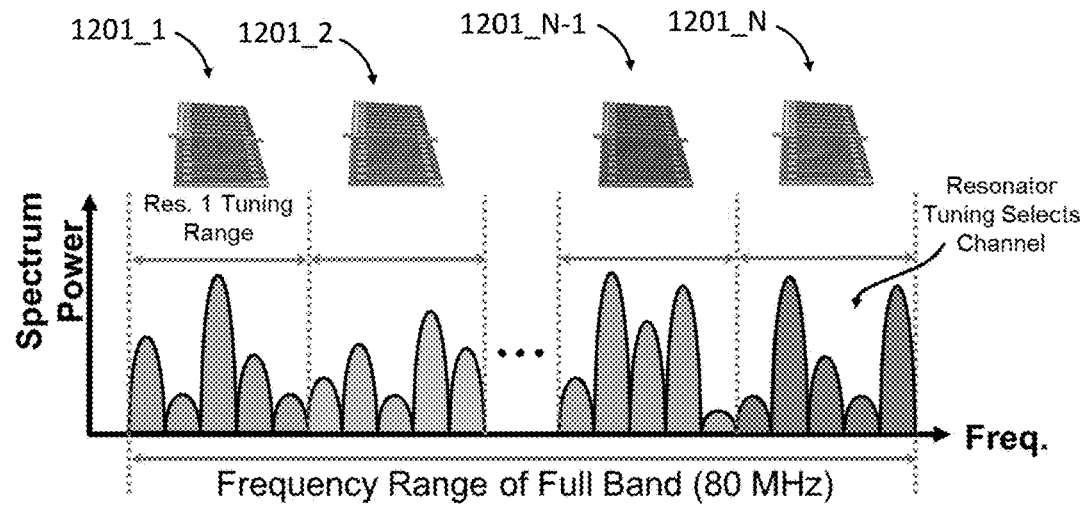

As shown in FIG. 12A, a super-regenerative receiver comprising of an array of N resonators 1201_1 to 1201_N connected to a feedback element 1207 using a switch network may offer support over a wide band of frequencies or may offer the capability to communicate with additional FSK-based protocols. Each resonator in the array may be tuned to operate at a resonance frequency within a given frequency range using a tuning element. In some embodiments, the resonance frequency of a given resonator may be tuned using a variable capacitor coupled to one or more electrodes of the resonator. In some embodiments, the frequency range of resonators in the array form an overlapping or non-overlapping continuum of frequencies supported by the super-regenerative receiver (non-overlapping continuum shown in FIG. 12B). In some embodiments, the frequency range of resonators in the array may form two or more disjoint continua of frequencies supported by the super-regenerative receiver (e.g., a group of resonators in the array supporting 900-910 MHz and the remaining resonators in the array supporting 950-970 MHz). In some embodiments, the array of resonators may be coupled via a switch to one or more feedback elements in a differential-mode configuration.

Figure 17:
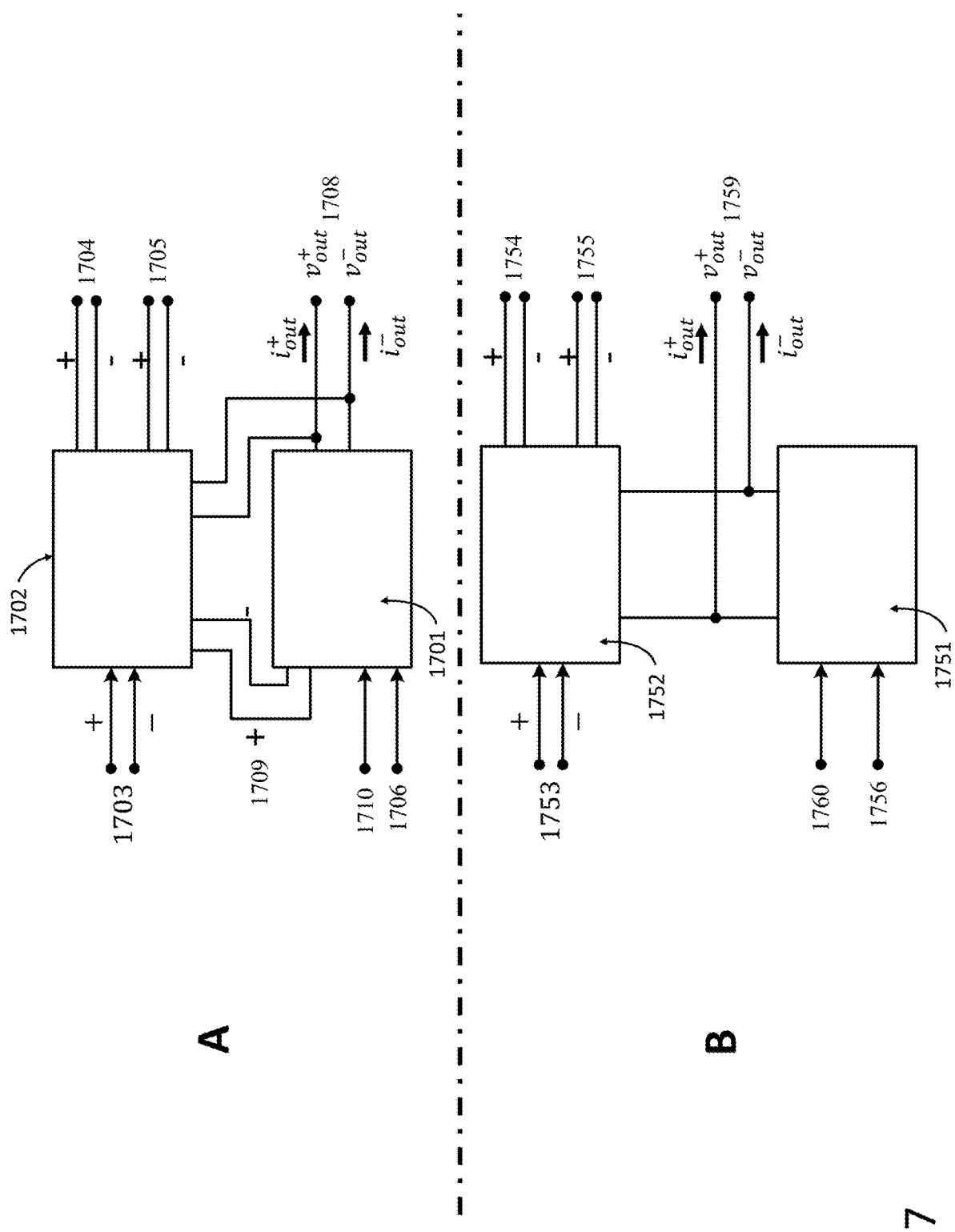
FIGS. 17A and 17B illustrate exemplary schematics for a closed-loop feedback element coupled to a resonator and a controlled impedance element coupled to a resonator, respectively, with each schematic illustrating differential connectivity between some ports of the two elements.

In some embodiments, the signals between a resonator and one or more elements in a receiver may be coupled differentially to improve performance. FIG. 17A illustrates an exemplary schematic of a closed-loop feedback element 1701 coupled to two ports of resonator 1702. In some embodiments, differential input port 1703 of the resonator is coupled to a signal from an antenna (not shown). In some embodiments, differential port 1704 of the resonator 1702 is coupled to a tuning element (not shown). In some embodiments, differential port 1705 of the resonator 1702 is coupled to an input of a response sensing element (not shown). In some embodiments, an output of the response sensing element is coupled to input 1706 of the closed-loop feedback element 1701. The closed-loop feedback element 1701 differential ports (1708, 1709) are each connected to two or more electrodes of the resonator 1702. In some embodiments, input 1710 of the closed-loop feedback element 1701 is connected to one or more clock signals. The one or more clock signals, based on instructions from a controller, may control the gain of the closed-loop feedback element 1701 during the period of a single symbol to generate a signal (e.g., from the resonator 1702 (e.g., via differential port 1708)) processed by other components (e.g., envelope detector, comparator, output flip-flop) as described herein. In some of the embodiments, one or more of the ports (e.g., 1706, 1710) may be differential ports. In some embodiments, one or more of the differential ports (e.g., 1704, 1708) may be non-differential ports.

FIG. 17B illustrates an exemplary schematic of a feedback element comprising a 1-port controlled impedance element 1751 coupled to differential port 1759 of resonator 1752. In some embodiments, differential input port 1753 of the resonator 1752 is coupled to a signal from an antenna (not shown). In some embodiments, differential port 1754 of the resonator 1752 is coupled to a tuning element (not shown). In some embodiments, differential port 1755 of the resonator 1752 is coupled to an input of a response sensing element (not shown). In some embodiments, an output of the response sensing element is coupled to input 1756 of the controlled impedance element 1751. In some embodiments, input 1760 of the controlled impedance element 1751 is connected to one or more clock signals. The one or more clock signals, based on instructions from a controller, may control the feedback gain of the controlled impedance element 1751 during the period of a single symbol to generate a signal (e.g., from the resonator 1752 (e.g., via differential port 1759)) processed by other components (e.g., envelope detector, comparator, output flip-flop) as described herein. In some of the embodiments, one or more of the ports (e.g., 1756, 1760) may be differential ports. In some embodiments, one or more of the differential ports (e.g., 1754, 1759) may be non-differential ports.

In some embodiments, N sets of resonators and feedback elements may be combined to allow discrimination of N-FSK signals. For example, 4-FSK signals may be detected with 4 separate resonators+feedback elements wherein the resonance frequency for each resonator is set to a different frequency corresponding to the different frequencies of the 4-FSK modulation.

Figure 13:
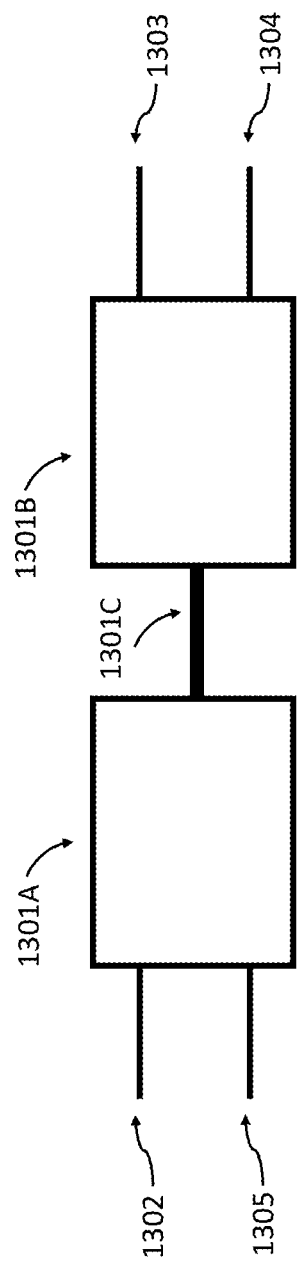
FIG. 13 illustrates an exemplary schematic for a composite resonator comprising two mechanical resonators coupled to each other via a mechanical coupling beam.

In some embodiments, a mechanically-coupled array of resonators allows further reduction in Rx without a significant reduction in Q-factor. During fabrication, a number (N) of identical single resonators may be coupled with mechanical coupling beams sized to half the acoustic wavelength in whichever displacement mode the coupling is using (or multiples thereof; e.g., ½, 1, 1½, etc.). This forces the individual resonators to move in-phase with each other at a single resonance frequency. Effectively, an array of resonators mechanically coupled in this manner behaves as one single resonator with a similar Q-factor, but increased coupling or electrodes for each added individual resonator. FIG. 13 shows an exemplary resonator comprising two resonators 1301A and 1301B coupled mechanically via coupling beam 1301C. The exemplary resonator includes ports 1302, 1303, 1304, and 1305.

Similarly, coupling of multiple resonators (or arrays of resonators) such that the resonator motion is out of phase, by using electrical coupling or quarter-wavelength mechanical coupling beams (or odd multiples thereof; e.g., ¼, ¾, 5/4, etc.), may produce a broadened passband filter. Such filters may likewise be used in the systems disclosed herein to allow larger reception bandwidth, a flatter passband, or faster filter roll-off with frequency out of channel, than that offered by a single resonator.

In some embodiments, a port of a resonator may be connected to two or more of the following: a port of a feedback element, a port of a tuning element, and a port of a response sensing element. In some embodiments, a response sensing element may sense the response (e.g., amplitude, energy, power) of an incoming signal from the antenna. In some embodiments, an output of a response sensing element may be based at least in part upon the response (e.g., amplitude, energy, power) of an incoming signal from the antenna. In some embodiments, a response sensing element may provide output to a feedback element or a tuning element based at least in part upon an incoming signal from an antenna. In some embodiments, a response sensing element may be coupled to the same port as a port used for RF input (e.g., from an antenna).

In the schematics and description, a response sensing element (e.g., detector) may be implemented in a number of ways. While drawn using a diode symbol—a simple detector—the detector may be made using any one or any combination of the following: envelope detector, voltage peak detector, Vrms detector, diode detector, power (or energy) detector, voltage square detector, notch filter, nonlinear filter, nonlinear notch filter, and even a counter-based system (that counts the difference in cycles or frequency between an on or off-frequency signal).

In some embodiments, a resonance frequency of a resonator may differ from a target frequency (e.g., the mark frequency) due to, among other factors, one or more of: device fabrication variations (e.g., due to variations in: film deposition thickness, etch undercut, lithography), changes in resonator temperature (e.g., due to changes in ambient temperature), and changes in mechanical properties of the resonator (e.g., creep, fatigue, stress relaxation). In some embodiments, a resonance frequency of a resonator may be tuned by laser trimming one or more resonator elements. In some embodiments, a resonance frequency of a resonator may be tuned to a target frequency using active temperature control of the resonator (e.g., temperature-controlled oven). The resonance frequency tuning based on active temperature control may remove resonance frequency drift due to changes in the ambient temperature. The resonance frequency tuning with active temperature control may correct resonance frequency variations due to device variations by driving the resonator to a target frequency by tuning the temperature control set point.

In some embodiments, a resonator and a tuning element are designed to permit a sufficiently broad tuning range for the resonator resonance frequency to account for any variations encountered during fabrication and use. In some embodiments, a controller provides instructions to activate an on-chip or off-chip frequency reference (e.g., quartz-based resonator or oscillator or other form of frequency reference) to provide a frequency reference signal. In some embodiments, the frequency reference signal is at a target resonance frequency for the resonator (independent from the resonance frequency of the resonator). In some embodiments, the frequency reference signal may be lower or higher than the target resonance frequency. In some embodiments, the frequency reference signal may be used by a frequency synthesizer to generate the target resonance frequency based on a numerical frequency multiplier factor. In some embodiments, the frequency multiplier may be less than one or greater than one. In some embodiments, the controller provides instructions to apply the target resonance frequency to the resonator input. The controller instructs a tuning element to adjust the resonance frequency of the resonator (e.g., by varying a tuning capacitor, by adjusting the DC voltage bias). In one embodiment, with the input amplitude of the target resonance frequency fixed, the controller instructs the tuning element to sweep over a range of resonance frequencies achievable by the resonator (e.g., sweeping over a range of capacitance values if the tuning element controls the resonance frequency using a variable capacitance) while capturing the response of the resonator via an output of a response sensing element. The controller instructs the tuning element to adjust the resonance frequency of the resonator to a value where a maximum response was detected by the response sensing element.

Frequency tuning may also be implemented in some embodiments by use of a frequency difference detector (e.g., an analog or digital Phase-Locked Loop (PLL) incorporating one or more dividers, multipliers, fractional-N architecture, phase detector, and/or other typical PLL architecture or other frequency comparison system (e.g., frequency counter)) to compare an external reference frequency (e.g., clock) or a target resonance frequency to a resonator resonance frequency. In some embodiments, the external reference frequency is related to the target resonance frequency for the resonator (independent from the resonance frequency of the resonator) by a numerical frequency multiplier factor. In some embodiments, the resonator may be configured with loop gain >1 to form an oscillator and using a response signal of the oscillations from the resonator in the comparison by the frequency difference detector (e.g., to drive the divider or fractional-N circuitry or other PLL circuit configuration). In some embodiments, locking of the resonator resonance frequency to the external reference frequency via a tuning element (sweeping the resonance frequency) then allows a measurement of the tuning parameter needed, which may then be applied by the tuning element to tune the resonator even after disconnecting the PLL and the external reference frequency.

In some embodiments, a controller executes any of the above resonator frequency tuning processes based on a set schedule. In some embodiments, a controller executes any of the above resonator frequency tuning processes based on one or more of the following: resonator temperature, time elapsed since last tune, magnitude of last tuning adjustment, and the like. By executing the resonator frequency tuning process as needed, significant power savings may be realized. The scheduling of the resonance frequency tuning permits correction of slowly drifting resonance frequency and ensures the long-term sensitivity of the resonator.

Figure 14:
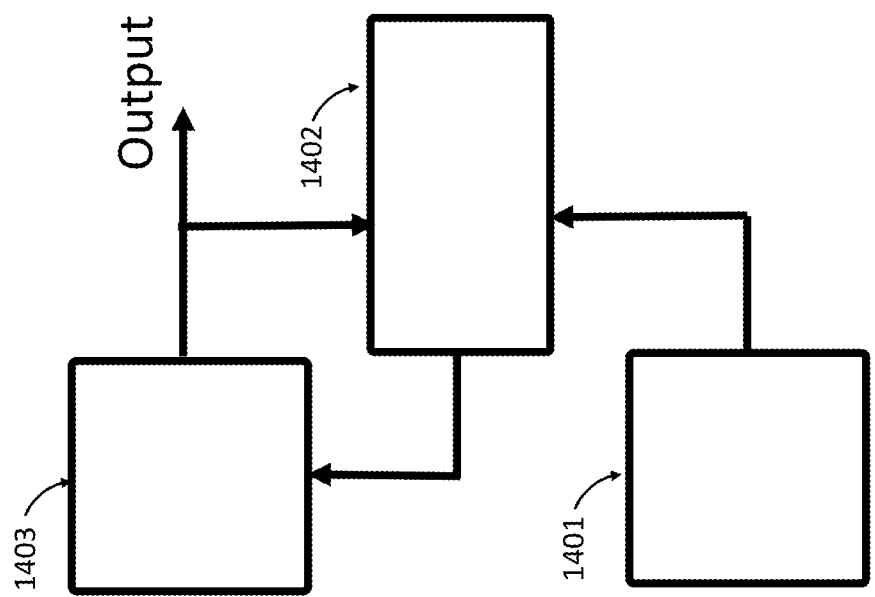
FIG. 14 illustrates an exemplary schematic for a reference frequency generator used to tune the resonance frequency of a resonator in a super-regenerative receiver.

FIG. 14 illustrates an exemplary schematic of a system incorporating a frequency reference. A high stability reference oscillator 1401 output is fed to a frequency comparator and trim circuit 1402. The output of the frequency comparator and trim circuit 1402 is fed to a tunable oscillator 1403. The output of the tunable oscillator 1403 is fed to a resonator (not shown) that needs to be tuned. The output of the tunable oscillator 1403 is also fed back to the frequency comparator and trim circuit 1402. The activation of the frequency reference and tuning process control is managed by a controller.

Resonator resonance frequency tuning may be based on a measurement of the resonance frequency using one of the approaches described above or based on, for some sources of resonance frequency variations, stored information for the resonator. For example, temperature-resonance frequency information characterizing the change in the resonance frequency of the resonator as a function of temperature may be used to tune the resonance frequency. In some embodiments, the resonance frequency of the resonator may be tuned based on a measurement of a temperature associated with the resonator and the stored temperature-resonance frequency information. In another example, resonance frequency information specific to a given resonator (e.g., resonance frequency of a given resonator (e.g., based on fabrication variations)) may be used to tune the resonance frequency.

In some embodiments, the same circuit used for receiving data using a RF super-regenerative receiver may be used to enable RF transmit operation. With frequency tuned to the frequency corresponding to the data to be transmitted (e.g., '0' or '1') and an amplifier set to a selected gain, a continuous RF carrier may be generated and transmitted. Data to be transmitted may be used to vary the tuned frequency of a resonator while an output of the resonator is amplified and connected to an antenna.

In some embodiments, frequency tuning capability of a resonator in a receiver additionally allows the resonator system (e.g., MEMS-based resonator coupled to a feedback element) to operate as an FSK or other frequency modulation-based transmitter, enabling a complete transceiver in one simple device. In some embodiments, MEMS-based systems are operated as a closed-loop oscillator (loop gain set above 1) with FSK modulation enabled via an applied tuning voltage on one or more electrodes of the MEMS resonator, such transmitters offer direct carrier generation at the RF frequency of interest without the power-hungry complexity of previous PLL-based MEMS transmitters. In some embodiments, instead of an applied tuning voltage, the use of a variable capacitance connected to one or more ports of a resonator may be used to shift frequency. Similarly, amplitude modulation can be affected in some embodiments through varying the gain of a feedback element. Additional embodiments may use the MEMS (or other resonator)-based oscillator as a tunable reference for a standard fractional-N (among other configurations) PLL synthesizer to produce a modulated carrier for transmission. In some embodiments, a power amplifier and switching circuitry may be included to produce desired transmission power and shared antenna access.

It will be appreciated by one skilled in the art that resonators described in this disclosure may be selected (without limitation) from one or more of: comb-driven resonators, piezo coupled resonators, ring resonators, contour mode ring resonators, lamb-wave resonators, contour mode resonators, wine-glass disk resonators, wine-glass ring resonators, Lame mode resonators, bar resonators, flexural beam resonators, membrane resonators, comb-driven flexural-mode resonators, center-supported disk resonators, surface acoustic wave (SAW) devices, bulk acoustic wave (BAW) devices, film bulk acoustic resonator (FBAR) devices, lateral overmoded bulk acoustic-wave resonator (LOBAR) devices, piezo actuated resonators, internal dielectric actuated resonators, internally-transduced resonators having a capacitive couple formed from a semiconductor junction, and combinations of the foregoing. In some embodiments, the systems and approaches described here may be applied to resonator systems using any combination of inductors, capacitors, and resistors. In some embodiments, an on- or off-chip resonator technology, e.g., quartz or inductor-capacitor resonator, may be used. In some embodiments, the disclosed super-regenerative receiver systems and methods may be used in or with oscillators without an RF wireless signal coupled to the oscillator.

The specific frequencies of operation described in a given embodiment are exemplary. The frequency may be any value or range as desired for the specific protocol used. Similarly, the Q-factor may be any value or range as desired for the specific resonator design. Similarly, the dimensions of the resonator may be selected based on any requirements (e.g., technological requirements, commercial requirements).

In some embodiments, resonators may be fabricated using a commercially-available CMOS processes, a CMOS-compatible MEMS process, a MEMS processes that is not CMOS compatible, or a combination thereof. In some embodiments, a resonator may be assembled using two or more substrates that are combined (e.g., laterally, stacked) to form the resonator, wherein each substrate is fabricated using a commercially-available CMOS processes, a CMOS-compatible MEMS process, a MEMS processes that is not CMOS compatible, or a combination thereof. In some embodiments, a resonator may be fabricated by stacking, bonding, and patterning one or more substrates (e.g., resonator fabricated from 10 um thick silicon substrate bonded to standard thickness silicon substrate).

Figure 15:
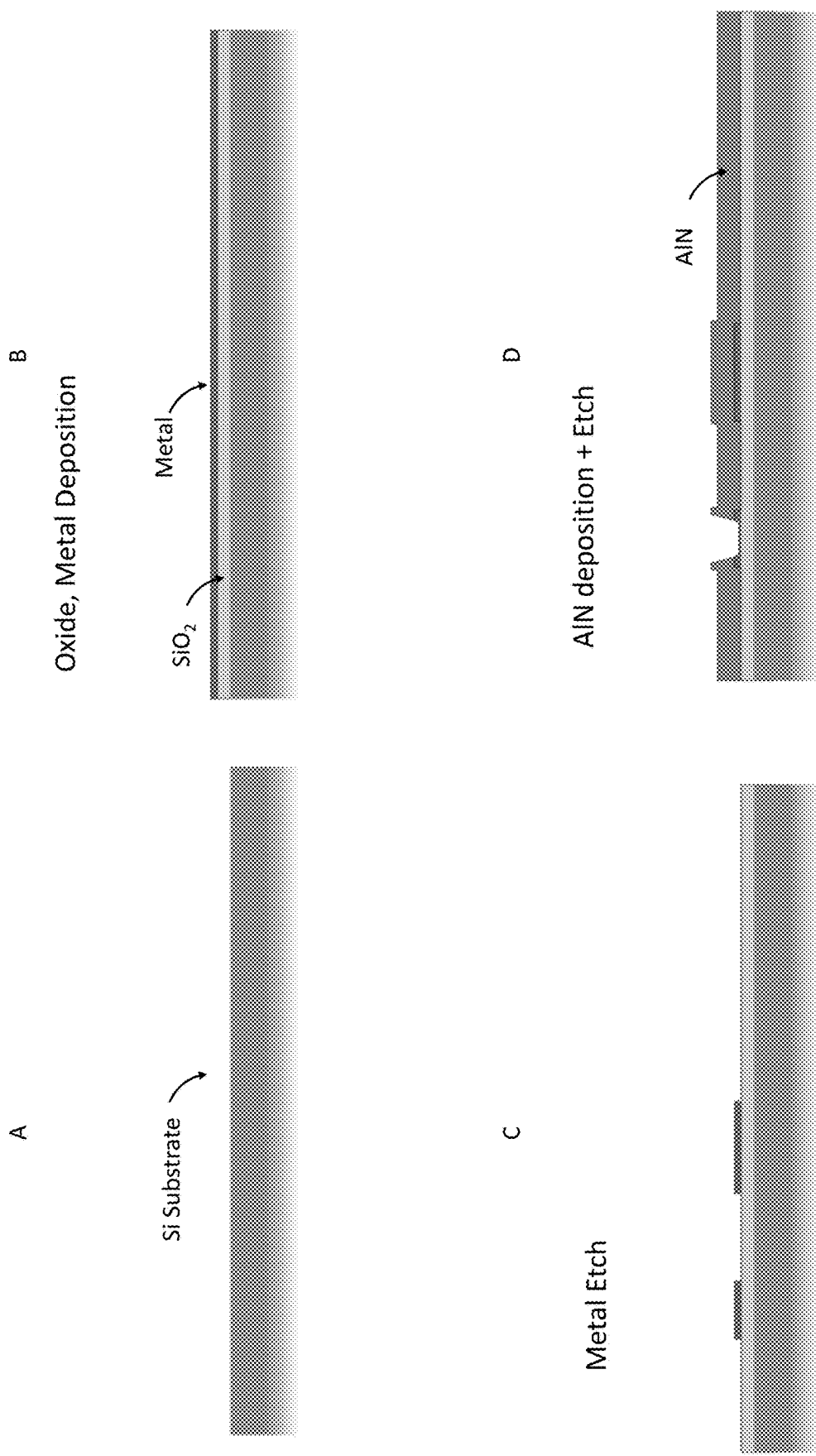
FIGS. 15A, 15B, 15C, and 15D illustrate steps of an exemplary process flow to fabricate a resonator.
Figure 16:
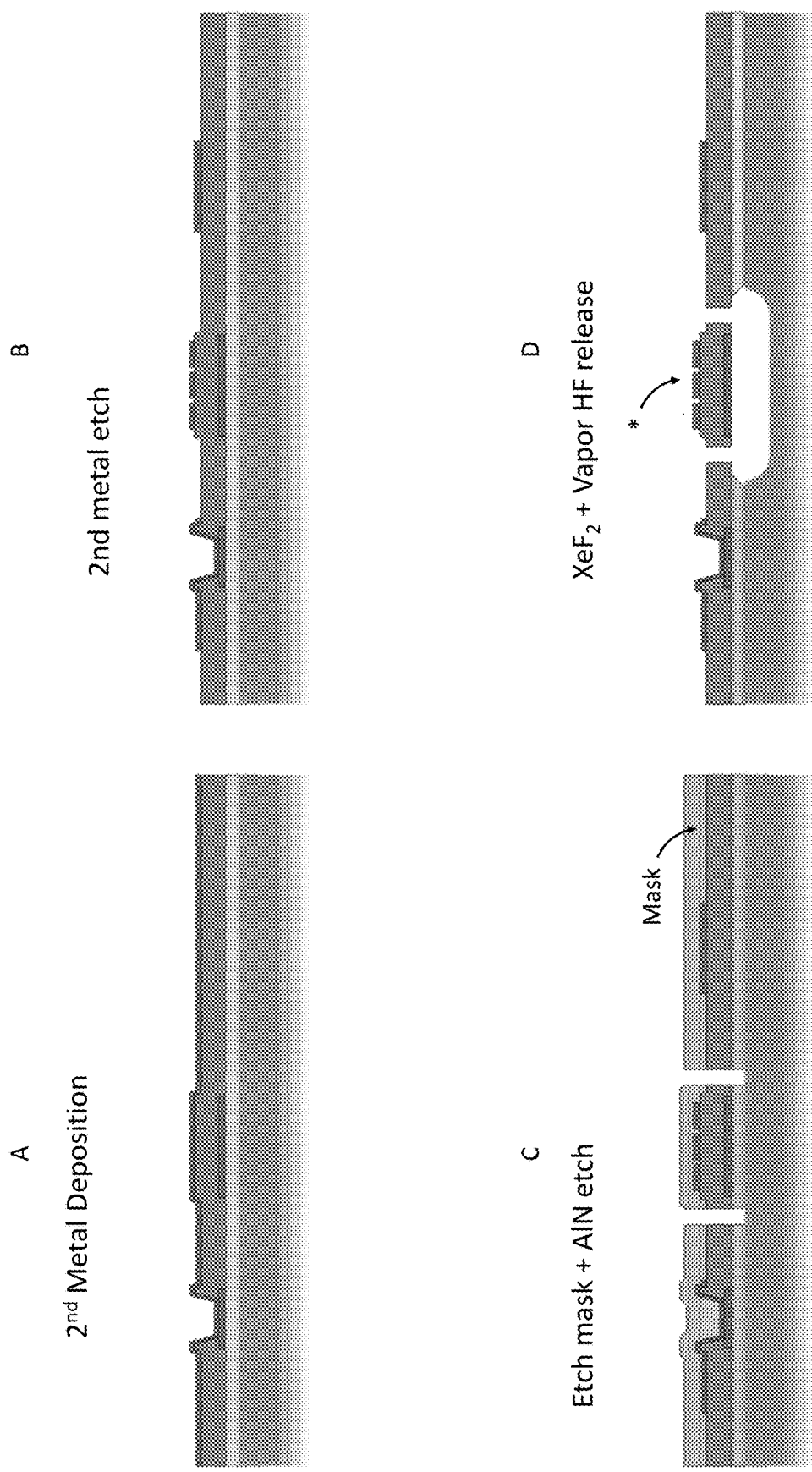
FIGS. 16A, 16B, 16C, and 16D illustrate steps of an exemplary process flow to fabricate a resonator.

An exemplary process for fabricating a piezoelectric transduced lamb-wave MEMS-based resonator described herein is shown in FIGS. 15 and 16. The fabrication process begins with a silicon substrate (FIG. 15A) with an oxide ($SiO_2$) layer (Layer 1) and a metal layer (Layer 2) deposited on top (FIG. 15B). The metal layer (Layer 2) is patterned using a first mask (e.g., using photoresist and lithography) and etched (e.g., using a plasma or wet etch) (FIG. 15C). An aluminum nitride layer (Layer 3) is deposited on the patterned substrate. The aluminum nitride layer (Layer 3) is patterned using a second mask and etched (e.g., using a $Cl_2/BCl_3$ plasma) (FIG. 15D). A second metal layer (Layer 4) is deposited on the patterned substrate (FIG. 16A). The second metal layer (Layer 4) is patterned using a third mask and etched (FIG. 16B). The aluminum nitride layer (Layer 3), and the oxide layer (Layer 1) is patterned using a fourth mask and etched (e.g., using a plasma or wet etch) (FIG. 16C). The patterned structure is then etched using $XeF_2$ gas and vapor-phase HF to create a suspended AlN plate (using Layer 3), supported by support beams (not shown), with optional electrodes on top (using patterned Layer 4) and optional electrodes on bottom (using patterned Layer 2) (FIG. 16D). Electrical contact to Layer 2 electrodes or Layer 4 electrodes on the AlN plate may be established by running one or more traces along one or more support beams for each electrode.

Hermetic sealing of the MEMS resonator may be necessary to reduce aging effects and prevent variation with environmental factors. This may be accomplished via a hermetic package seal, or a chip-level hermetic sealing process on the resonator. The chip-level process may be amenable to mass production, as it's costs and complexity are lower. Many such chip-level process exists, though the exact technology used depends on the foundry and MEMS/resonator process.

In some embodiments, challenges in building a complete market-ready product may include assembly, where the MEMS die can be wire bonded together with the CMOS die using traditional multi-die wire bonding using wedge or ball bonds and with the dies either side by side or stacked. Alternative approaches for tighter integration and lower packaging costs may include flip chip or full wafer bonding, or even MEMS fabrication directly on top of CMOS.

In some embodiments, the design of the higher-level stack components is an important part of the power consumption of the full radio chipset. This includes both the low-level hardware controller circuitry, the data processing and higher-level software stack needed for most protocols, as well as general purpose micro processing capability needed for end-use applications. To this end, low power design is necessary, which can, in some embodiments, include sub-threshold circuit design, or inclusion of an additional power-optimized IC die in the same package with the other components to provide a low-power ARM core or similar. In so doing, a price or power optimized CMOS node may be used for the RF components, while a more expensive but higher performing node may be used for the microprocessor.

As used herein, "coupled" in the specification and in the claims, unless clearly indicated to the contrary, should be understood to mean coupled at least one of capacitively, inductively, resistively (e.g., connected electrically using a wire or a trace), or via a piezo-electric effect.

As used herein, "controller" in the specification and in the claims, unless clearly indicated to the contrary, refers to a processing unit present anywhere in the stack of the radio chipset, including the physical layer.

While various embodiments have been described and illustrated herein, those of ordinary skill in the art will readily envision a variety of other means or structures for performing the function or obtaining the results or one or more of the advantages described herein. More generally, those skilled in the art will readily appreciate that all parameters, dimensions, materials, and configurations described herein are meant to be exemplary and that the actual parameters, dimensions, materials, or configurations will depend upon the specific application or applications for which the disclosed teachings are used. Those skilled in the art will recognize, or be able to ascertain using no more than routine experimentation, equivalents to the specific embodiments described herein. It is, therefore, to be understood that the foregoing embodiments are presented by way of example only and that, within the scope of the appended claims and equivalents thereto, embodiments may be practiced otherwise than as specifically described and claimed. Embodiments of the present disclosure are directed to each individual feature, system, article, material, kit, or method described herein. In addition, any combination of two or more such features, systems, articles, materials, kits, or methods from different embodiments, if such features, systems, articles, materials, kits, or methods are not mutually inconsistent, is included within the scope of the present disclosure.

The above-described embodiments can be implemented in any of numerous ways. For example, the embodiments may be implemented using hardware, software or a combination thereof. When implemented in software, the software code can be executed on one or more processing units, whether provided in a single computer or distributed among multiple computers.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

A computer employed to implement at least a portion of the functionality described herein may comprise one or more memory units, one or more processing units (also referred to herein simply as "processors"), one or more communication interfaces, one or more display units, and one or more user input devices. A memory unit may comprise any computer-readable media and may store computer instructions (also referred to herein as "processor-executable instructions") for implementing the various functionalities described herein. A processing unit (e.g., any suitable controller (e.g., programmable controller, ASIC, FPGA), core (e.g., CPU, GPU, DSP, SoC), or any combination thereof) may be used to execute the instructions. The communication interface(s) may be coupled to a wired or wireless network, bus, or other communication means and may therefore allow the computer to transmit communications to or receive communications from components in the same device or from other devices. The display unit(s) may be provided, for example, to allow a user to view various information in connection with execution of the instructions. The user input device(s) may be provided, for example, to allow the user to make manual adjustments, make selections, enter data or various other information, or interact in any of a variety of manners with the processor during execution of the instructions.

The various methods or processes outlined herein may be coded as software that is executable on one or more processors that employ any one of a variety of operating systems or platforms. Additionally, such software may be written using any of a number of suitable programming languages or programming or scripting tools, and also may be compiled as executable machine language code or intermediate code that is executed on a framework or virtual machine.

The concept described herein may be embodied as a computer readable medium (or multiple computer readable media) (e.g., a computer memory, one or more floppy discs, compact discs, optical discs, magnetic tapes, flash memories, circuit configurations in Field Programmable Gate Arrays or other semiconductor devices, or other non-transitory medium or tangible computer storage medium) encoded with one or more programs that, when executed on one or more processing units or computers, perform methods that implement the various embodiments described herein. The computer readable medium or media can be transportable, such that the program or programs stored thereon can be loaded onto one or more different processing units or computers to implement various aspects and embodiments described herein.

The terms "program" or "software" are used herein in a generic sense to refer to any type of computer code or set of computer-executable instructions that can be employed to program a processing unit or computer to implement various aspects of embodiments as described herein. Additionally, according to one aspect, one or more computer programs that when executed perform methods or operations described herein need not reside on a processing unit or computer but may be distributed in a modular fashion amongst a number of different processing units or computers to implement various aspects or embodiments described herein.

Computer-executable instructions may be in many forms, such as program modules, executed by one or more computers or other devices. Generally, program modules include routines, programs, objects, components, or data structures that perform particular tasks or implement particular abstract data types. Typically, the functionality of the program modules may be combined or distributed as desired in various embodiments.

The data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. Any suitable mechanism may be used to establish a relationship between information in fields of a data structure, including through the use of pointers, tags or other mechanisms that establish relationship between data elements.

The concepts described herein may be embodied as one or more methods, of which an example has been provided. The acts performed as part of the method may be ordered in any suitable way, unless otherwise limited herein. Accordingly, embodiments may be constructed in which acts are performed in an order different than illustrated, which may include performing some acts simultaneously, even though shown as sequential acts in illustrative embodiments.

The indefinite articles "a" and "an," as used herein in the specification and in the claims, unless clearly indicated to the contrary, should be understood to mean "at least one."

Except where indicated otherwise, references to "or" may be construed as a logical non-exclusive or so that any terms described using "or" may indicate any of a single, more than one, and all of the described terms.

In the claims, as well as in the specification above, all transitional phrases such as "comprising," "including," "carrying," "having," "containing," "involving," "holding," "composed of," and the like are to be understood to be open-ended, i.e., to mean including but not limited to.

INCORPORATION BY REFERENCE

All references, articles, publications, patents, patent publications, and patent applications cited herein are incorporated by reference in their entireties for all purposes. However, mention of any reference, article, publication, patent, patent publication, and patent application cited herein is not, and should not be taken as an acknowledgement or any form of suggestion that it constitutes valid prior art or form part of the common general knowledge in any country in the world, or that it discloses essential matter.

FURTHER EMBODIMENTS OF THE INVENTION

Other subject matter contemplated by the present disclosure is set out in the following numbered embodiments:

1. An RF receiver comprising:
a resonator comprising two or more electrodes, wherein each of the two or more electrodes is coupled to at least one other electrode of the two or more electrodes, and the two or more electrodes comprise at least one feedback electrode; and
a feedback element coupled to the at least one feedback electrode, wherein the feedback element has a gain, the gain is controlled based at least in part upon one or more feedback control signals, and the gain is controlled to change from a first value to a second value through at least one intermediate value during a period of a single symbol.

2. The RF receiver of embodiment 1, wherein the feedback element comprises a controlled impedance element.

3. An RF receiver as in any one of embodiments 1-2, wherein the two or more electrodes comprise at least two feedback electrodes, and the controlled impedance element is coupled differentially to the at least two feedback electrodes.

4. An RF receiver as in any one of embodiments 1-3, wherein at least one of the one or more feedback control signals controls at least one of the at least one feedback electrode to couple to a dissipative element during at least a portion of the period of a single symbol.

5. The RF receiver of embodiment 1, wherein the two or more electrodes comprise at least two feedback electrodes, the feedback element comprises a closed-loop feedback element, and the closed-loop feedback element is coupled to the at least two feedback electrodes.

6. The RF receiver of embodiment 5, wherein the resonator comprises four or more electrodes, the four or more electrodes comprise at least four feedback electrodes, and the closed-loop feedback element is coupled differentially to the at least four feedback electrodes.

7. The RF receiver of embodiment 5, wherein at least one of the one or more feedback control signals controls at least one of the at least two feedback electrodes to couple to a dissipative element during at least a portion of the period of a single symbol.

8. The RF receiver of embodiment 5, wherein at least one of the one or more feedback control signals controls at least two of the at least two feedback electrodes to couple to each other via a dissipative element to each other during at least a portion of the period of a single symbol.

9. An RF receiver as in any one of embodiments 1-8, further comprising:
a tuning element coupled to at least one tuning electrode, wherein the two or more electrodes comprise the at least one tuning electrode, the tuning element is controlled by one or more frequency control signals, and a resonance frequency of the resonator is controlled by the tuning element.

10. The RF receiver of embodiment 9, wherein the tuning element comprises one or more capacitors, at least one of the one or more frequency control signals controls an output capacitance of the tuning element, and the resonance frequency is based at least in part upon the output capacitance of the tuning element.

11. The RF receiver of embodiment 9, wherein the tuning element comprises a voltage source, at least one of the one or more frequency control signals controls an output voltage of the tuning element, and the resonance frequency is based at least in part upon the output voltage of the tuning element.

12. An RF receiver as in any one of embodiments 9-11, wherein at least one of the one or more frequency control signals is based at least in part upon a temperature associated with the resonator.

13. An RF receiver as in any one of embodiments 9-12, wherein at least one of the at least one feedback electrode and at least one of the at least one tuning electrode are coupled to a first electrode of the two or more electrodes.

14. An RF receiver as in any one of embodiments 9-13, further comprising:
a response sensing element coupled to at least one response sense electrode, wherein the two or more electrodes comprise the at least one response sense electrode, an output of the response sensing element is based at least in part upon a response of the resonator, and at least one of the frequency control signals is based at least in part upon the output of the response sensing element.

15. The RF receiver of embodiment 14, wherein the response of the resonator is the amplitude of the voltage on at least one of the at least one response sense electrode, and the resonance frequency is based at least in part upon the output of the response sensing element.

16. An RF receiver as in one of embodiments 1-15, wherein the gain is a loop gain, the first value corresponds to the loop gain being zero or less, the intermediate value corresponds to the loop gain being between zero and one, and the second value corresponds to the loop gain being 1 or more.

17. An RF receiver as in one of embodiments 1-15, wherein the gain is a loop gain, and the first value corresponds to the loop gain being zero or less.

18. An RF receiver as in one of embodiments 1-15, wherein the gain is a loop gain, and the intermediate value corresponds to the loop gain being less than one.

19. An RF receiver as in one of embodiments 1-15, wherein at least one of the one or more feedback control signals controls the gain to change to a negative value during at least a portion of the period of a single symbol.

20. An RF receiver as in one of embodiments 1-15, wherein the first value of the gain corresponds to the feedback element having negative gain.

21. An RF receiver as in one of embodiments 1-15, wherein the intermediate value is controllable, and the intermediate value may be selected from two or more target values.

22. An RF receiver as in one of embodiments 1-21, wherein the resonator type comprises at least in at least one of the following MEMS categories: a surface micromachined micromechanical structure, a bulk micromachined micromechanical structure, a piezoelectrically-actuatable micromechanical structure, and a capacitively-actuatable micromechanical structure.

23. An RF receiver as in one of embodiments 1-22, wherein the resonator has a first Q-factor with the gain equal to the first value, the resonator has a second Q-factor with the gain equal to the intermediate value, and the first Q-factor is different from the second Q-factor.

24. An RF receiver as in one of embodiments 1-23, further comprising:
a response sensing element coupled to at least one response sense electrode, wherein the two or more electrodes comprise the at least one response sense electrode, and an output of the response sensing element is based at least in part upon a response of the resonator.

25. The RF receiver of embodiment 24, wherein the resonator has a first Q-factor with the gain equal to the first value, the resonator has a second Q-factor with the gain equal to the intermediate value, and the first Q-factor is different from the second Q-factor.

26. An RF receiver as in one of embodiments 24-25, wherein the response of the resonator is the amplitude of the voltage on at least one of the at least one response sense electrode.

27. An RF receiver as in one of embodiments 24-25, wherein the response of the resonator is the magnitude of the current sensed using at least one of the at least one response sense electrode.

28. An RF receiver as in one of embodiments 24-27, wherein at least one of the one or more feedback control signals is based at least in part upon the output of the response sensing element.

29. An RF receiver as in one of embodiments 24-28, wherein at least one of the first value, the second value, or the intermediate value is based at least in part upon the output of the response sensing element.

30. An RF receiver as in one of embodiments 4, 7, and 8, wherein the dissipative element comprises a resistive element.

The invention claimed is:

1. An RF receiver comprising:
a resonator comprising two or more electrodes, wherein each of the two or more electrodes is coupled to at least one other electrode of the two or more electrodes, and the two or more electrodes comprise at least one feedback electrode; and
a feedback element coupled to the at least one feedback electrode, wherein the feedback element has one or more inputs to receive one or more feedback control signals to control a gain of the feedback element, and the gain is controlled to change from a first value to a second value through at least one intermediate value during a period of a single symbol based at least in part upon the one or more feedback control signals.

2. The RF receiver of claim 1, wherein the feedback element comprises a controlled impedance element.

3. The RF receiver of claim 2, wherein at least one of the one or more feedback control signals controls at least one of the at least one feedback electrode to couple to a dissipative element during at least a portion of the period of a single symbol.

4. The RF receiver of claim 1, wherein the two or more electrodes comprise at least two feedback electrodes, the feedback element comprises a closed-loop feedback element, and the closed-loop feedback element is coupled to the at least two feedback electrodes.

5. The RF receiver of claim 4, wherein the resonator comprises four or more electrodes, the four or more electrodes comprise at least four feedback electrodes, and the closed-loop feedback element is coupled differentially to the at least four feedback electrodes.

6. The RF receiver of claim 4, wherein at least one of the one or more feedback control signals controls at least one of the at least two feedback electrodes to couple to a dissipative element during at least a portion of the period of a single symbol.

7. The RF receiver of claim 1, further comprising:
a tuning element coupled to at least one tuning electrode, wherein the two or more electrodes comprise the at least one tuning electrode, the tuning element is controlled by the one or more frequency control signals, and a resonance frequency of the resonator is controlled by the tuning element.

8. The RF receiver of claim 7, wherein at least one of the one or more frequency control signals is based at least in part upon a temperature associated with the resonator.

9. The RF receiver of claim 1, wherein the gain is a loop gain, the first value corresponds to the loop gain being zero or less, the intermediate value corresponds to the loop gain being between zero and one, and the second value corresponds to the loop gain being 1 or more.

10. The RF receiver of claim 9, wherein the resonator type comprises at least one of the following MEMS categories: a surface micromachined micromechanical structure, a bulk micromachined micromechanical structure, a piezoelectrically-actuatable micromechanical structure, and a capacitively-actuatable micromechanical structure.

11. The RF receiver of claim 1, wherein the intermediate value is controllable, and the intermediate value is selected from two or more target values.

12. The RF receiver of claim 1, wherein the resonator type comprises at least one of the following MEMS categories: a surface micromachined micromechanical structure, a bulk micromachined micromechanical structure, a piezoelectrically-actuatable micromechanical structure, and a capacitively-actuatable micromechanical structure.

13. The RF receiver of claim 1, wherein the resonator has a first Q-factor with the gain equal to the first value, the resonator has a second Q-factor with the gain equal to the intermediate value, and the first Q-factor is different from the second Q-factor.

14. The RF receiver of claim 1, further comprising:
a response sensing element coupled to at least one response sense electrode, wherein the two or more electrodes comprise the at least one response sense electrode, and an output of the response sensing element is based at least in part upon a response of the resonator.

15. The RF receiver of claim 14, wherein at least one of the one or more feedback control signals is based at least in part upon the output of the response sensing element.

16. The RF receiver of claim 14, wherein at least one of the first value, the second value, or the intermediate value is based at least in part upon the output of the response sensing element.

17. The RF receiver of claim 1, wherein the resonator comprises an LC-resonator.

18. A system to capture symbol data from a wireless signal using an RF receiver, the system comprising:
  a resonator comprising two or more electrodes, wherein each of the two or more electrodes is coupled to at least one other electrode of the two or more electrodes, and the two or more electrodes comprise at least one feedback electrode;
  a feedback element coupled to the at least one feedback electrode, wherein the feedback element has a gain, and the gain is controlled based at least in part upon one or more feedback control signals;
  one or more processors; and
  one or more memories operatively coupled to at least one of the one or more processors and having instructions stored thereon that, when executed by at least one of the one or more processors, cause the system to:
  provide instructions to set the gain to a first value during a first portion of a period of a single symbol, wherein the gain is set based at least in part upon at least one of the one or more feedback control signals comprising first data;
  provide instructions to set the gain to an intermediate value during a second portion of the period of the single symbol, wherein the gain is set based at least in part upon at least one of the one or more feedback control signals comprising second data, and the intermediate value is between the first value and a second value; and
  provide instructions to set the gain to the second value during a third portion of the period of the single symbol, wherein the gain is set based at least in part upon at least one of the one or more feedback control signals comprising third data.

19. The system of claim 18, wherein the gain is a loop gain, the first value corresponds to the loop gain being zero or less, the intermediate value corresponds to the loop gain being between zero and one, and the second value corresponds to the loop gain being 1 or more.

20. The system of claim 18, further comprising:
  a tuning element coupled to at least one tuning electrode, wherein the two or more electrodes comprise the at least one tuning electrode, the tuning element is controlled by the one or more frequency control signals, and a resonance frequency of the resonator is controlled by the tuning element.

21. The system of claim 18, wherein the resonator type comprises at least one of the following MEMS categories: a surface micromachined micromechanical structure, a bulk micromachined micromechanical structure, a piezoelectrically-actuatable micromechanical structure, and a capacitively-actuatable micromechanical structure.

22. The system of claim 18, further comprising:
  a response sensing element coupled to at least one response sense electrode, wherein the two or more electrodes comprise the at least one response sense electrode, an output of the response sensing element is based at least in part upon a response of the resonator, and at least one of the one or more feedback control signals is based at least in part upon the output of the response sensing element.

23. The system of claim 18, wherein the resonator comprises an LC-resonator.

24. A computer-implemented method of capturing symbol data from a wireless signal using an RF receiver, wherein the RF receiver comprises a resonator and a feedback element, the resonator comprises two or more electrodes, each of the two or more electrodes is coupled to at least one other electrode of the two or more electrodes, the two or more electrodes comprise at least one feedback electrode, the feedback element is coupled to the at least one feedback electrode, the feedback element has a gain, and the gain is controlled based at least in part upon one or more feedback control signals, the method comprising:
  providing, by at least one of one or more processors, instructions to set the gain to a first value during a first portion of a period of a single symbol, wherein the gain is set based at least in part upon the at least one of the one or more feedback control signals comprising first data;
  providing, by at least one of the one or more processors, instructions to set the gain to an intermediate value during a second portion of the period of the single symbol, wherein the gain is set based at least in part upon at least one of the one or more feedback control signals comprising second data, and the intermediate value is between the first value and a second value; and
  providing, by at least one of the one or more processors, instructions to set the gain to the second value during a third portion of the period of the single symbol, wherein the gain is set based at least in part upon at least one of the one or more feedback control signals comprising third data.

25. The method of claim 24, wherein the gain is a loop gain, the first value corresponds to the loop gain being zero or less, the intermediate value corresponds to the loop gain being between zero and one, and the second value corresponds to the loop gain being 1 or more.

26. The method of claim 24, wherein the RF receiver further comprises a tuning element coupled to at least one tuning electrode, the two or more electrodes comprise the at least one tuning electrode, the tuning element is controlled by the one or more frequency control signals, and a resonance frequency of the resonator is controlled by the tuning element.

27. The method of claim 24, wherein the resonator type comprises at least one of the following MEMS categories: a surface micromachined micromechanical structure, a bulk micromachined micromechanical structure, a piezoelectrically-actuatable micromechanical structure, and a capacitively-actuatable micromechanical structure.

28. The method of claim 24, wherein the RF receiver further comprises a response sensing element coupled to at least one response sense electrode, the two or more electrodes comprise the at least one response sense electrode, an output of the response sensing element is based at least in part upon a response of the resonator, and at least one of the one or more feedback control signals is based at least in part upon the output of the response sensing element.

\* \* \* \* \*